(12) United States Patent
Choi et al.

(10) Patent No.: US 12,207,520 B2
(45) Date of Patent: Jan. 21, 2025

(54) DISPLAY APPARATUS HAVING LIGHT-EMITTING DEVICE

(71) Applicant: LG DISPLAY CO., LTD., Seoul (KR)

(72) Inventors: Hong Seok Choi, Seoul (KR); Chun Ki Kim, Seoul (KR); Ahn Ki Kim, Busan (KR); Kyung Hoon Han, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 490 days.

(21) Appl. No.: 17/562,491

(22) Filed: Dec. 27, 2021

(65) Prior Publication Data
US 2022/0208860 A1    Jun. 30, 2022

(30) Foreign Application Priority Data

Dec. 31, 2020 (KR) .................. 10-2020-0190027
Nov. 2, 2021 (KR) .................. 10-2021-0148857

(51) Int. Cl.
*H01L 27/32* (2006.01)
*H10K 59/122* (2023.01)
*H10K 59/38* (2023.01)

(52) U.S. Cl.
CPC .......... *H10K 59/38* (2023.02); *H10K 59/122* (2023.02)

(58) Field of Classification Search
None
See application file for complete search history.

(56) References Cited

U.S. PATENT DOCUMENTS

| | | | |
|---|---|---|---|
| 10,115,924 B2* | 10/2018 | Kum | H10K 50/852 |
| 11,302,875 B2* | 4/2022 | Shin | H10K 85/654 |
| 2011/0133227 A1* | 6/2011 | Lee | H10K 50/125 |
| | | | 257/89 |
| 2017/0155070 A1* | 6/2017 | Han | H10K 59/32 |
| 2019/0198788 A1* | 6/2019 | Park | H10K 50/19 |
| 2022/0208860 A1* | 6/2022 | Choi | H10K 59/32 |

FOREIGN PATENT DOCUMENTS

| | | |
|---|---|---|
| KR | 2008-0046460 A | 5/2008 |
| KR | 2017-0061522 A | 6/2017 |

* cited by examiner

*Primary Examiner* — Long Pham
(74) *Attorney, Agent, or Firm* — POLSINELLI PC

(57) ABSTRACT

A light-emitting device includes a light-emitting layer between a first electrode and a second electrode, he light emitted from the light-emitting device may display a white color, the light-emitting layer may include a plurality of emission stacks, each of the emission stacks includes at least one emission material layer, one of the emission stacks may include a stacked structure of a red emission material layer and a blue emission material layer, thus improving the white balance and increasing color viewing angle.

15 Claims, 16 Drawing Sheets

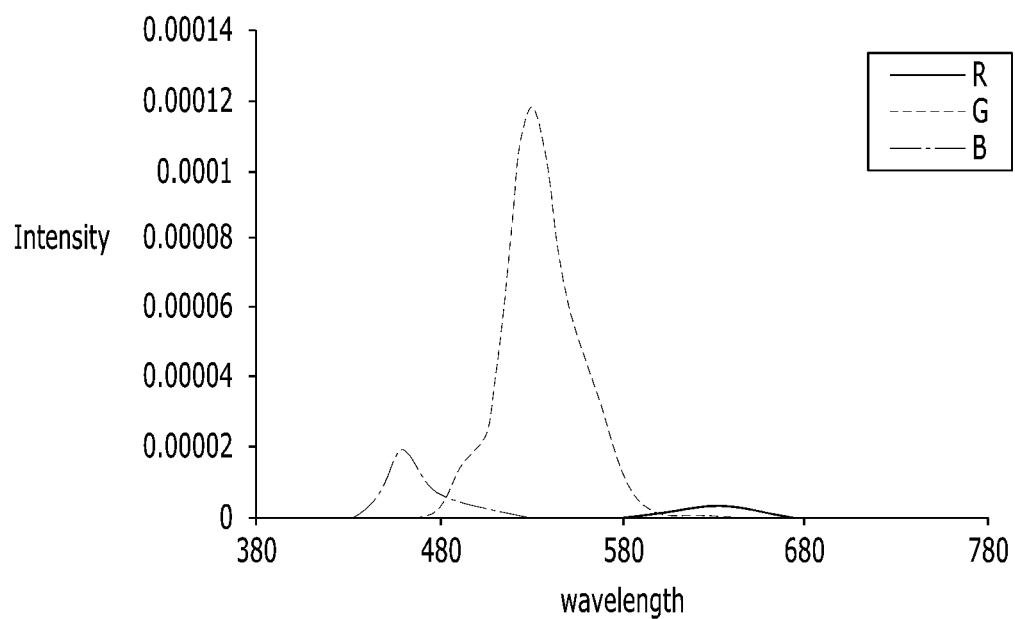
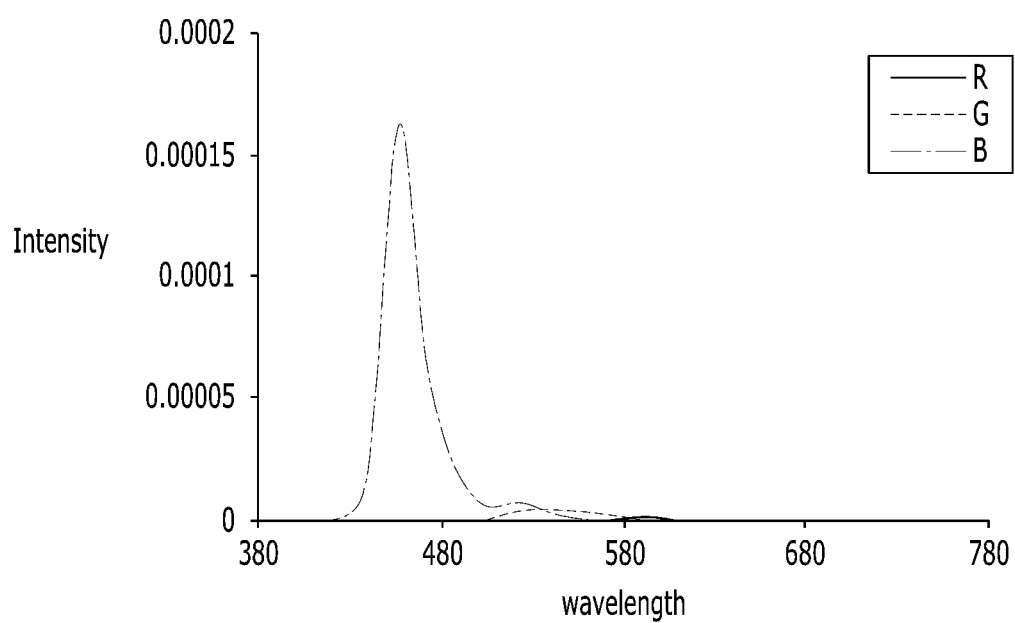

DISPLAY APPARATUS HAVING LIGHT-EMITTING DEVICE

CROSS-REFERENCE TO RELATED APPLICATIONS

This application claims the priority of Korean Patent Application Nos. 10-2020-0190027 filed on Dec. 31, 2020 and 10-2021-0148857 filed on Nov. 2, 2021, which are hereby incorporated by reference in their entirety.

BACKGROUND

Field of the Disclosure

The present disclosure relates to a display apparatus in which a light-emitting device emitting light realizing a white color is disposed on an emission area of a device substrate.

Description of the Background

Generally, a display apparatus provides an image to user. For example, the display apparatus may include at least one light-emitting device. The light-emitting device may emit light displaying a specific color. For example, the light-emitting device may include a light-emitting layer between a first electrode and a second electrode.

The light emitted from the light-emitting device may display a white color. For example, the light-emitting layer may include a plurality of emission stacks. Each of the emission stacks may include an emission material layer. For example, the light-emitting layer may have a stacked structure of a first emission stack including a red emission material layer, a second emission stack including a green emission material layer, and a third emission stack including a blue emission material layer.

However, the blue emission material layer may have luminous efficiency lower than the red emission material layer and the green emission material layer. Thus, in the display apparatus, the white balance and the color temperature may be lowered. And, when the second electrode of each light emitting device has a relatively high reflectance to improve light extraction efficiency, the phase change of the light may be increased in proportion to the distance between the second electrode and the corresponding light emitting material layer. That is, in the display apparatus, the luminance and the color tone of the light emitted from each light-emitting device in an oblique direction may be rapidly reduced. Therefore, in the display apparatus, the quality and the color viewing angle of the image may deteriorate.

SUMMARY

Accordingly, the present disclosure is directed to a display apparatus that substantially obviates one or more problems due to limitations and disadvantages described above.

More specifically, the present disclosure is to provide a display apparatus capable of improving the white balance of the light emitted from each light-emitting device.

The present disclosure is also to provide a display apparatus capable of improving the color viewing angle of the light emitted from each light-emitting device.

Additional advantages and features of the disclosure will be set forth in part in the description which follows and in part will become apparent to those having ordinary skill in the art upon examination of the following or may be learned from practice of the disclosure. Other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a display apparatus comprising a first electrode. A second electrode is disposed on the first electrode. A light-emitting layer is disposed between the first electrode and the second electrode. The light-emitting layer generates light displaying a white color. The light-emitting layer includes four emission stacks and charge generation layers. The charge generation layers are disposed between the emission stacks. One of the emission stacks has a stacked structure of a first red emission material layer and a first blue emission material layer.

The first blue emission material layer may be in contact with the first red emission material layer.

The light-emitting layer may include a first emission stack, a second emission stack, a third emission stack and a fourth emission stack, which are sequentially stacked on the first electrode. The first emission stack may include the first red emission material layer and the first blue emission material layer.

The reflectance of the second electrode may be higher than the reflectance of the first electrode.

The second emission stack may include a second blue emission material layer. The third emission stack may include a green emission material layer. The fourth emission stack may include a third blue emission material layer.

The second blue emission material layer and the third blue emission material layer may include the same material as the first blue emission material layer.

The fourth emission stack may further include a second red emission material layer.

The second red emission material layer may include the same material as the first red emission material layer.

In another aspect, there is provided a display apparatus comprising a device substrate. A bank insulating layer is disposed on the device substrate. The bank insulating layer defines a first emission area. A first light-emitting device is disposed on the first emission area of the device substrate. The first light-emitting device includes a first electrode, a light-emitting layer and a second electrode, which are sequentially stacked on the device substrate. An encapsulation element is disposed on the first light-emitting device. The light-emitting layer has a stacked structure of a first emission stack, a second emission stack, a third emission stack and a fourth emission stack. The first emission stack includes a first red emission material layer and a first blue emission material layer. The second emission stack includes a second blue emission material layer. The third emission stack includes a green emission material layer. The fourth emission stack includes a third emission material layer.

The third emission stack may be disposed between the second emission stack and the fourth emission stack.

The second emission stack may be disposed close to the first emission stack. The second emission stack may further include a second red emission material layer. A stacking order of the second red emission material layer and the second blue emission material layer may be the same as a stacking order of the first red emission material layer and the first blue emission material layer.

The first red emission material layer may be disposed between the first electrode and the first blue emission material layer.

The first emission area may realize a red color. The bank insulating layer may define a second emission area realizing a white color, a third emission area realizing a green color, and a fourth emission area realizing a blue color. The first emission area, the second emission area, the third emission area and the fourth emission area may be arranged to be repeated in a direction. The second emission area may be disposed between the first emission area and the third emission area.

A second light-emitting device may be disposed on the second emission area of the device substrate. A third light-emitting device may be disposed on the third emission area of the device substrate. A fourth light-emitting device may be disposed on the fourth emission area of the device substrate. The second light-emitting device, the third light-emitting device and the fourth light-emitting device may be the same structure as the first light-emitting device.

A red color filter may be disposed between the device substrate and the first light-emitting device. A green color filter may be disposed between the device substrate and the third light-emitting device. A blue color filter may be disposed between the device substrate and the fourth light-emitting device.

BRIEF DESCRIPTION OF THE DRAWINGS

The accompanying drawings, which are included to provide a further understanding of the disclosure and are incorporated in and constitute a part of this application, illustrate aspect(s) of the disclosure and together with the description serve to explain the principle of the disclosure.

In the drawings:

FIGS. 4A to 4C and 5A to 5C are graphs showing emission spectrum of the light emitted from a red pixel area, a green pixel area and a blue pixel area, during low grayscale driving according to the arrangement of the pixel areas.

DETAILED DESCRIPTION

Figure 1:
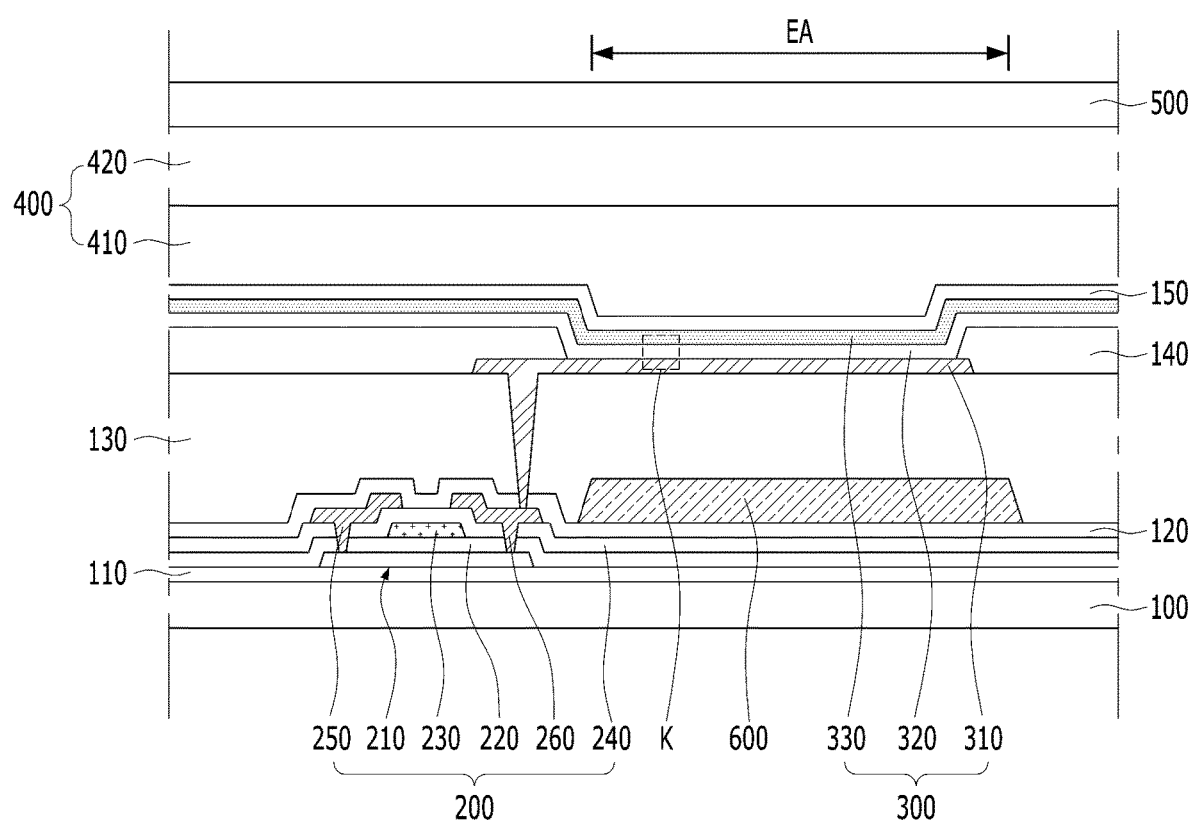
FIG. 1 is a view schematically showing a display apparatus according to an aspect of the present disclosure.

Hereinafter, details related to the above features, technical configurations, and operational effects of the aspects of the present disclosure will be clearly understood by the following detailed description with reference to the drawings, which illustrate some aspects of the present disclosure. Here, the aspects of the present disclosure are provided in order to allow the technical sprit of the present disclosure to be satisfactorily transferred to those skilled in the art, and thus the present disclosure may be embodied in other forms and is not limited to the aspects described below.

In addition, the same or extremely similar elements may be designated by the same reference numerals throughout the specification, and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of the present disclosure.

The terms used in the specification of the present disclosure are merely used in order to describe particular aspects, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example aspects belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Figure 2:
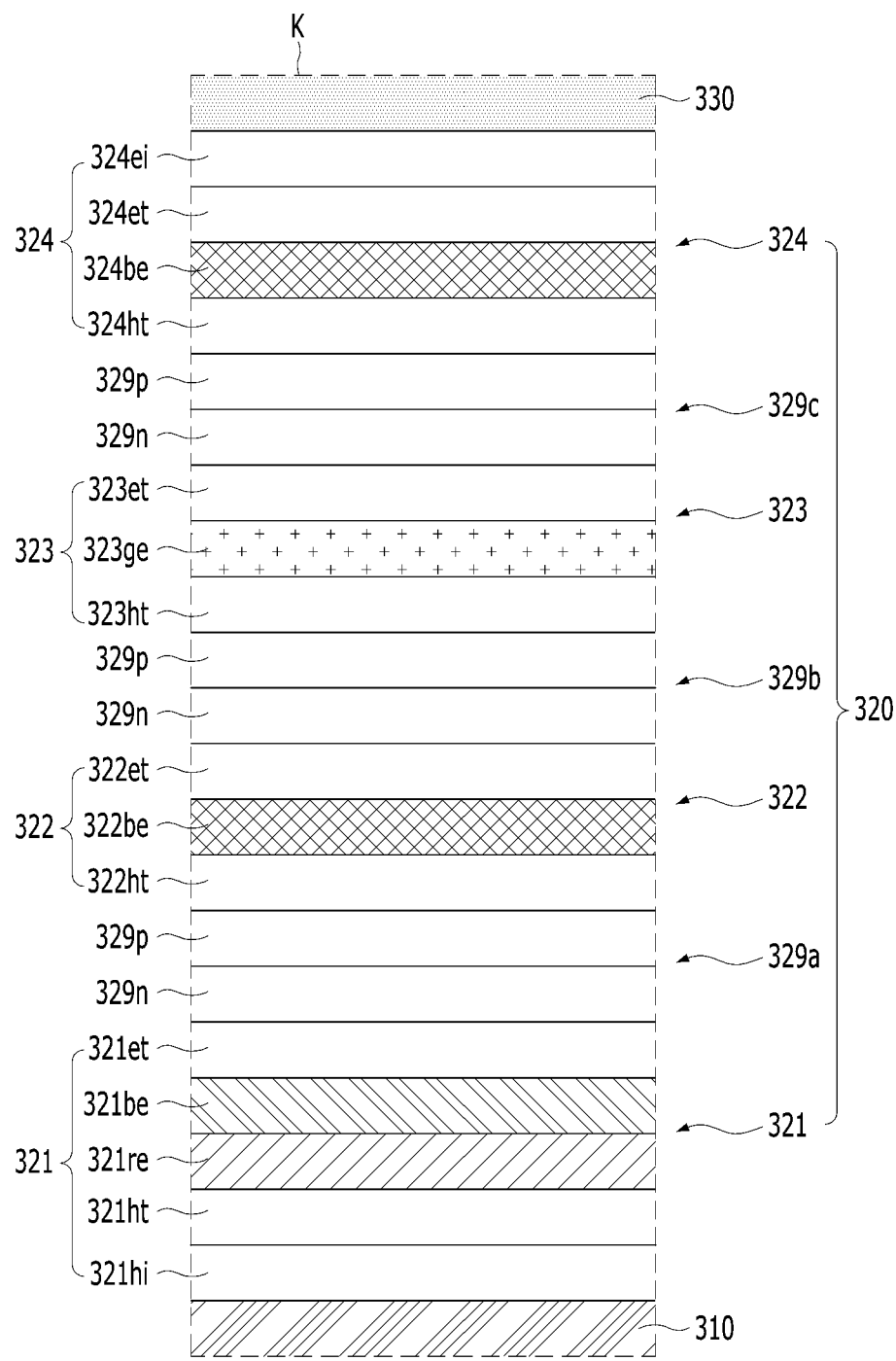
FIG. 2 is an enlarged view of K region in FIG. 1.

FIG. 1 is a view schematically showing a display apparatus according to an aspect of the present disclosure. FIG. 2 is an enlarged view of K region in FIG. 1.

Referring to FIGS. 1 and 2, the display apparatus according to the aspect of the present disclosure may include a device substrate 100. The device substrate 100 may include an insulating material. The device substrate 100 may include a transparent material. For example, the device substrate 100 may glass or plastic.

A driving circuit and a light-emitting device 300 may be disposed on the device substrate 100. The light-emitting device 300 may be electrically connected to the driving circuit. The driving circuit may supply a driving current corresponding to a data signal to the light-emitting device 300 according to a gate signal. For example, the driving circuit may include at least one thin film transistor 200. The thin film transistor 200 may include a semiconductor pattern 210, a gate insulating layer 220, a gate electrode 230, an interlayer insulating layer 240, a source electrode 250 and a drain electrode 260.

The semiconductor pattern 210 may include a semiconductor material. For example, the semiconductor pattern 210 may include amorphous silicon (a-Si) or polycrystalline silicon (poly-Si). The semiconductor pattern 210 may be an oxide semiconductor. For example, the semiconductor pattern 210 may include a metal oxide, such as IGZO.

The semiconductor pattern 210 may include a source region, a drain region and a channel region. The channel region may be disposed between the source region and the drain region. The source region and the drain region may have a resistance lower than the channel region. For example, the source region and the drain region may include a conductorized region of the oxide semiconductor.

The gate insulating layer 220 may be disposed on the semiconductor pattern 210. The gate insulating layer 220 may extend beyond the semiconductor pattern 210. For example, a side of the semiconductor pattern 210 may be covered by the gate insulating layer 220. The gate insulating layer 220 may include an insulating material. For example, the gate insulating layer 220 may include an inorganic insulating material, such as silicon oxide (SiO) and silicon nitride (SiN). The gate insulating layer 220 may include a material having a high dielectric constant. For example, the gate insulating layer 220 may include a high-K material, such as hafnium oxide (HfO). The gate insulating layer 220 may have a multi-layer structure.

The gate electrode 230 may be disposed on the gate insulating layer 220. The gate electrode 230 may overlap the channel region of the semiconductor pattern 210. For example, the gate electrode 230 may be insulated from the semiconductor pattern 210 by the gate insulating layer 220. The gate electrode 230 may include a conductive material. For example, the gate electrode 230 may include a metal, such as aluminum (Al), titanium (Ti), copper (Cu), chrome (Cr), molybdenum (Mo) and tungsten (W). The channel region of the semiconductor pattern 210 may have electrical conductivity corresponding to a voltage applied to the gate electrode 230.

The interlayer insulating layer 240 may be disposed on the gate electrode 230. The interlayer insulating layer 240 may extend beyond the gate electrode 230. For example, a side of the gate electrode 230 may be covered by the interlayer insulating layer 240. The interlayer insulating layer 240 may be in contact with the gate insulating layer 220 at the outside of the gate electrode 230. For example, the interlayer insulating layer 240 may extend along the gate insulating layer 220. The interlayer insulating layer 240 may include an insulating material. For example, the interlayer insulating layer 240 may include an inorganic insulating material, such as silicon oxide (SiO) and silicon nitride (SiN).

The source electrode 250 may be disposed on the interlayer insulating layer 240. The source electrode 250 may include a conductive material. For example, the source electrode 250 may include a metal, such as aluminum (Al), titanium (Ti), copper (Cu), chrome (Cr), molybdenum (Mo) and tungsten (W). The source electrode 250 may be insulated from the gate electrode 230 by the interlayer insulating layer 240. For example, the source electrode 250 may include a material different from the gate electrode 230.

The source electrode 250 may be electrically connected to the source region of the semiconductor pattern 210. For example, the gate insulating layer 220 and the interlayer insulating layer 240 may include a source contact hole partially exposing the source region of the semiconductor pattern 210. The source electrode 250 may include a portion overlapping with the source region of the semiconductor pattern 210. For example, the source electrode 250 may be in direct contact with the source region of the semiconductor pattern 210 in the source contact hole.

The drain electrode 260 may be disposed on the interlayer insulating layer 240. The drain electrode 260 may include a conductive material. For example, the drain electrode 260 may include a metal, such as aluminum (Al), titanium (Ti), copper (Cu), chrome (Cr), molybdenum (Mo) and tungsten (W). The drain electrode 260 may be insulated from the gate electrode 230 by the interlayer insulating layer 240. For example, the drain electrode 260 may include a material different from the gate electrode 230. The drain electrode 260 may include the same material as the source electrode 250.

The drain electrode 260 may be electrically connected to the drain region of the semiconductor pattern 210. The drain electrode 260 may be spaced away from the source electrode 250. For example, the gate insulating layer 220 and the interlayer insulating layer 240 may include a drain contact hole partially exposing the drain region of the semiconductor pattern 210. The drain electrode 260 may include a portion overlapping with the drain region of the semiconductor pattern 210. For example, the drain electrode 260 may be in direct contact with the drain region of the semiconductor pattern 210 in the drain contact hole.

A device buffer layer 110 may be disposed between the device substrate 100 and the driving circuit. The device buffer layer 110 may prevent pollution due to the device substrate 100 in a process of forming the driving circuit. For example, an upper surface of the device substrate 100 toward the thin film transistor 200 may be completely covered by the device buffer layer 110. The device buffer layer 110 may include an insulating material. For example, the device buffer layer 110 may include an inorganic insulating material, such as silicon oxide (SiO) and silicon nitride (SiN).

A lower passivation layer 120 may be disposed on the driving circuit. The lower passivation layer 120 may prevent the damage of the driving circuit due to external impact and moisture. For example, a surface of the thin film transistor 200 opposite to the device substrate 100 may be completely covered by the lower passivation layer 120. The lower passivation layer 120 may extend beyond the semiconductor pattern 210 along the interlayer insulating layer 240. The lower passivation layer 120 may include an insulating material. For example, the lower passivation layer 130 may include an inorganic insulating material, such as silicon oxide (SiO) and silicon nitride (SiN).

An over-coat layer 130 may be disposed on the lower passivation layer 120. The over-coat layer 130 may remove a thickness difference due to the driving circuit. For example, an upper surface of the over-coat layer 130 opposite to the device substrate 100 may be a flat surface. The over-coat layer 130 may include an insulating material. The over-coat layer 130 may include a material different from the lower passivation layer 120. For example, the over-coat layer 130 may include an organic insulating material.

The light-emitting device 300 may be disposed on the over-coat layer 130. The light-emitting device 300 may emit light displaying a specific color. For example, the light-emitting device 300 may include a first electrode 310, a light-emitting layer 320 and a second electrode 330, which are sequentially stacked.

The first electrode 310 may be disposed close to the over-coat layer 130. The first electrode 310 may include a conductive material. The first electrode 310 may include a transparent material. For example, the first electrode 310 may be a transparent electrode made of a transparent conductive material, such as ITO and IZO.

The first electrode 310 may be electrically connected to the driving circuit. For example, the lower passivation layer 120 and the over-coat layer 130 may include an electrode contact hole partially exposing the drain electrode 260 of the thin film transistor 200. The first electrode 310 may be connected to the drain electrode 250 of the thin film transistor 200 through the electrode contact hole. Thus, in the display apparatus according to the aspect of the present disclosure, the driving current generated by the driving circuit may be provided to the first electrode 310 of the light-emitting device 300. The first electrode 310 may include a portion overlapping with the drain electrode 260 of the thin film transistor 200. For example, the first electrode 310 may be in direct contact with the drain electrode 260 of the thin film transistor 200 in the electrode contact hole.

The light-emitting layer 320 may generate light having luminance corresponding to a voltage difference between the first electrode 310 and the second electrode 330. For example, the light-emitting layer 320 may include an emission material layer (EML) including an emission material.

The emission material may include an organic material, an inorganic material or a hybrid material. For example, the display apparatus according to the aspect of the present disclosure may be an organic light-emitting display apparatus including the organic emission material.

The light generated by the light-emitting layer 320 may display a white color. The light-emitting layer 320 may include a plurality of the emission material layers. For example, the light-emitting layer 320 may include a first emission stack 321, a second emission stack 322, a third emission stack 323 and a fourth emission stack 324, which are sequentially stacked on the first electrode 310. Each of the first emission stack 321, the second emission stack 322, the third emission stack 323 and the fourth emission stack 324 may emit light. For example, the light-emitting layer 320 may include a first charge generation layer 329a between the first emission stack 321 and the second emission stack 322, a second charge generation layer 329b between the second emission stack 322 and the third emission stack 323, and a third charge generation layer 329c between the third emission stack 323 and the fourth emission stack 324.

Each of the first charge generation layer 329a, the second charge generation layer 329b and the third charge generation layer 329c may provide electrons or holes to adjacent emission stacks 321, 322, 323 and 324. For example, each of the first charge generation layer 329a, the second charge generation layer 329b and the third charge generation layer 329c may have a stacked structure of a n-type generating layer 329n and a p-type generating layer 329p. The n-type generating layer 329n and the p-type generating layer 329p of the first charge generation layer 329a may be arranged in the same order as the n-type generating layer 329n and the p-type generating layer 329p of the second charge generation layer 329b and the n-type generating layer 329n and the p-type generating layer 329p of the third charge generation layer 329c. For example, in the display apparatus according to the aspect of the present disclosure, if the first electrode 310 may function as anode and the second electrode 320 may function as cathode, the n-type generating layer 329n of each charge generation layer 329a, 329b and 329c may be disposed between the first electrode 310 and the p-type generating layer 329p of the corresponding charge generation layer 329a, 329b and 329c. Thus, in the display apparatus according to the aspect of the present disclosure, the electrons and the holes may be evenly supplied to each emission stack 321, 322, 323 and 324.

The first emission stack 321 disposed between the first electrode 310 and the first charge generation layer 329a may include a hole injection layer 321hi, a first hole transport layer 321ht, a red emission material layer 321re, a first blue emission material layer 321be and a first electron transport layer 321et, which are sequentially stacked. The first emission stack 321 may be in direct contact with the first electrode 310 and the first charge generation layer 329a. For example, the first electrode 310 may be in contact with the hole injection layer 321hi of the first emission stack 321, and the first charge generation layer 329a may be in contact with the first electron transport layer 321et of the first emission stack 321.

The red emission material layer 321re may generate light using the holes supplied through the hole injection layer 321hi and the first hole transport layer 321ht, and the electrons supplied through the first electron transport layer 321et. The red emission material layer 321re may generate the light displaying a red color. For example, the light generated by the red emission material layer 321re may have a peak wavelength of 640 nm to 720 nm. The red emission material layer 321re may include a red dopant and host material. The red dopant of the red emission material layer 321re may be a phosphorescent material. For example, the red emission material layer 321re may be formed by using CBP(carbazole biphenyl) or mCP(1,3-bis(carbazol-9-yl) as the host material, and being doped with a red dopant including at least one selected from the group consisting of Ir(Piq)3(Tris(1-phenylisoquinoline)iridium(III)), Ir(piq)2 (acac)(Bis(1-phenylisoquinoline)(acetylacetonate)iridium-III)), Ir(btp)2(acac)(Bis)2-benzo[b]thiophen-2-yl-pyridine) (acetylacetonate)iridiumIII)), Ir(BT)2(acac)(Bis(2-phenylbenzothazolato)(acetylacetonate)iridiumIII)).

The first blue emission material layer 321be may generate light using the holes supplied through the hole injection layer 321hi and the first hole transport layer 321ht, and the electrons supplied through the first electron transport layer 321et. The first blue emission material layer 321be may generate the light displaying a blue color. For example, the light generated by the first blue emission material layer 321be may have a peak wavelength of 440 nm to 480 nm. The first blue emission material layer 321be may include a blue dopant and host material. The blue dopant of the first blue emission material layer 321be may be a fluorescent material. For example, the first blue emission material layer 321be may be formed by using at least one selected from the group consisting of an anthracene derivative, a pyrene derivative and perylene derivative as the host material, and being doped with a pyrene-based blue dopant or a boron-based blue dopant.

The first blue emission material layer 321be may be in direct contact with the red emission material layer 321re. For example, the energy by recombination of the holes supplied through the hole injection layer 321hi and the first hole transport layer 321ht and the electrons supplied through the first electron transport layer 321et may be provided to the red emission material layer 321re and the first blue emission material layer 32be of the first emission stack 321. The excitons generated by the recombination of the holes and the electrons may be consisted of a singlet exciton in the form of a paired spin and a triplet exciton in the form of an unpaired spin according to the arrangement of the spin. In general, the fluorescent material may emit light using the singlet excitons, and the phosphorescent material may emit light using both the singlet excitons and the triplet excitons. Thus, in the display apparatus according to the aspect of the present disclosure, the blue dopant of the first blue emission material layer 321be which is a fluorescent material may emit the light using the singlet excitons, and the red dopant of the red emission material layer 321re which is a phosphorescent material may emit light using the triplet excitons. And, in the display apparatus according to the aspect of the present disclosure, the triplet exciton generated by the host material of the first blue emission material layer 321be which emits the light having a short wavelength may be used for the emission of the red emission material layer 321re which emits the light having a long wavelength by Dexter Energy Transfer (DET). Therefore, in the display apparatus according to the aspect of the present disclosure, the first emission stack 321 may emit both the light displaying the blue color and the light displaying the red color.

The second emission stack 322 disposed between the first charge generation layer 329a and the second charge generation layer 329b may include a second hole transport layer 322ht, a second blue emission material layer 322be and a second electron transport layer 322et, which are sequentially stacked. The second emission stack 322 may be in direct contact with the first charge generation layer 329a and the second charge generation layer 329b. For example, the second hole transport layer 322ht may be in contact with the first charge generation layer 329a, and the second electron transport layer 322et may be in contact with the second charge generation layer 329b.

The second blue emission material layer 322be may generate light using the holes supplied through the second hole transport layer 322ht and the electrons supplied through the second electron transport layer 322et. The second blue emission material layer 322be may generate the light displaying a blue color. For example, the light generated by the second blue emission material layer 322be may have a peak wavelength of 440 nm to 480 nm. The second blue emission material layer 322be may include a blue dopant and host material. The blue dopant of the second blue emission material layer 322be may be a fluorescent material. For example, the second blue emission material layer 322be may be formed by using at least one selected from the group consisting of an anthracene derivative, a pyrene derivative and perylene derivative as the host material, and being doped with a pyrene-based blue dopant or a boron-based blue dopant. The second blue emission material layer 322be may include the same blue dopant as the first blue emission material layer 321be. For example, the light generated by the second blue emission material layer 322be may have the same peak wavelength as the light generated by the first blue emission material layer 321be. Thus, in the display apparatus according to the aspect of the present disclosure, the efficiency and the color purity of the blue color may be improved. The host material of the second blue emission material layer 322be may be the same as the host material of the first blue emission material layer 321be.

The third emission stack 323 disposed between the second charge generation layer 329b and the third charge generation layer 329c may include a third hole transport layer 323ht, a green emission material layer 323ge and a third electron transport layer 323et, which are sequentially stacked. The third emission stack 323 may be in direct contact with the second charge generation layer 329b and the third charge generation layer 329c. For example, the third hole transport layer 323ht may be in contact with the second charge generation layer 329b, and the third electron transport layer 323et may be in contact with the third charge generation layer 329c.

The green emission material layer 323ge may generate light using the holes supplied through the third hole transport layer 323ht and the electrons supplied through the third electron transport layer 323et. The green emission material layer 323ge may generate the light displaying a green color. For example, the light generated by the green emission material layer 323ge may have a peak wavelength of 520 nm to 560 nm. The green emission material layer 323ge may include a green dopant and host material. The green dopant of the green emission material layer 323ge may be a phosphorescent material. For example, the green emission material layer 323ge may be formed by using CBP(carbazole biphenyl) or mCP(1,3-bis(carbazol-9-yl) as the host material, and being doped with a green dopant including at least one of Ir(ppy)3(fac tris(2-phenylpyridine)iridium), Ir(ppy)2(acac) and Ir(mpyp)3.

The fourth emission stack 324 disposed between the third charge generation layer 329c and the second electrode 330 may include a fourth hole transport layer 324ht, a third blue emission material layer 324be, a fourth electron transport layer 324et and an electron injection layer 324ei, which are sequentially stacked. The fourth emission stack 324 may be in direct contact with the third charge generation layer 329c and the second electrode 330. For example, the fourth hole transport layer 324ht may be in contact with the third charge generation layer 329c, and the electron injection layer 324ei may be in contact with the second electrode 330.

The third blue emission material layer 324be may generate light using the holes supplied through the fourth hole transport layer 324ht and the electrons supplied through the fourth electron transport layer 324et and the electron injection layer 324ei. The third blue emission material layer 324be may generate the light displaying a blue color. For example, the light generated by the third blue emission material layer 324be may have a peak wavelength of 440 nm to 480 nm. The third blue emission material layer 324be may include a blue dopant and host material. The dopant of the third blue emission material layer 324be may be a fluorescent material. For example, the third blue emission material layer 324be may be formed by using at least one selected from the group consisting of an anthracene derivative, a pyrene derivative and perylene derivative as the host material, and being doped with a pyrene-based blue dopant or a boron-based blue dopant. The third blue emission material layer 324be may include the same blue dopant as the second blue emission material layer 322be. For example, the light generated by the third blue emission material layer 324be may have the same peak wavelength as the light generated by the second blue emission material layer 322be. Thus, in the display apparatus according to the aspect of the present disclosure, the efficiency and the color purity of the blue color may be improved. The host material of the third blue emission material layer 324be may be the same as the host material of the second blue emission material layer 322be.

The second electrode 330 may include a conductive material. The second electrode 330 may include a material different from the first electrode 310. The transmittance of the second electrode 330 may be lower than the transmittance of the first electrode 310. The second electrode 330 may have a reflectance higher than the first electrode 310. For example, the second electrode 330 may include a metal, such as aluminum (Al) and silver (Ag). Thus, in the display apparatus according to the aspect of the present disclosure, the light generated by the light-emitting layer 320 may be emitted to outside through the first electrode 310 and the device substrate 100.

A bank insulating layer 140 may be disposed on the over-coat layer 130. The light-emitting device 300 may be independently controlled by the bank insulating layer 140. For example, the bank insulating layer 140 may cover an edge of the first electrode 310. The light-emitting layer 320 and the second electrode 330 may be stacked on a portion of the first electrode 310 exposed by the bank insulating layer 140. For example, the bank insulating layer 140 may define an emission area EA. The bank insulating layer 140 may include an insulating material. For example, the bank insulating layer 140 may include an organic insulating material. The bank insulating layer 140 may include a material different from the over-coat layer 130.

The driving circuit may be disposed outside the emission area EA. For example, the driving circuit may overlap the bank insulating layer 140. Thus, in the display apparatus according to the aspect of the present disclosure, the light emitted from the light-emitting device 300 may be not blocked by the driving circuit. That is, in the display apparatus according to the aspect of the present disclosure, the loss of the light due to the driving circuit may be prevented. Therefore, in the display apparatus according to the aspect of the present disclosure, the light extraction efficiency may be increased.

An upper passivation layer 150, an encapsulation element 400 and an encapsulating substrate 500 may be stacked on the light-emitting device 300 and the bank insulating layer 140. The upper passivation layer 150, the encapsulation element 400 and the encapsulating substrate 500 may prevent the damage of the light-emitting device 300 due to the external impact and moisture. For example, the encapsulating substrate 500 may include a metal, such as aluminum (Al), nickel (Ni) and iron (Fe). The upper passivation layer 150 and the encapsulation element 400 may include an insulating material. The encapsulation element 400 may include a material different from the upper passivation layer 150. For example, the upper passivation layer 150 may include an inorganic insulating material, and the encapsulation element 400 may include an organic insulating material. The encapsulation element 400 may include an adhesive material. For example, the encapsulating substrate 500 may be coupled to the device substrate 100 in which the light-emitting device 300 is formed, by the encapsulation element 400.

The encapsulation element 400 may have a multi-layer structure. For example, the encapsulation element 400 may include a lower encapsulating layer 410 disposed close to the upper passivation layer 150 and an upper encapsulating layer 420 disposed between the lower encapsulating layer 410 and the encapsulating substrate 500. Moisture-absorbing particles may be dispersed in the upper encapsulating layer 420. Thus, in the display apparatus according to the aspect of the present disclosure, the deterioration of the light-emitting device 300 due to the penetration of the external moisture may be prevented by the upper encapsulating layer 420, and the stress applied to the light-emitting device 300 due to the expansion of the moisture-absorbing particles may be relieved by the lower encapsulating layer 410.

A color filter 600 may be disposed between the device substrate 100 and the light-emitting device 300. The color filter 600 may realize various colors using the light emitted from the light-emitting device 300. For example, the color filter 600 may include a portion overlapping with the emission area EA. The color filter 600 may be disposed between the lower passivation layer 120 and the over-coat layer 130. Thus, in the display apparatus according to the aspect of the present disclosure, a thickness difference due to the color filter 600 may be removed by the over-coat layer 130.

A below table 1 shows the characteristics of the comparative display device D1 having a stacked structure of a first emission stack including a red emission material layer, a second emission stack including a first blue emission material layer, a third emission stack including a green emission material layer and a fourth emission stack including a second blue emission material layer, and the display device D2 according to the aspect of the present disclosure.

TABLE 1

|    | efficiency (cd/A) | | | | Color temperature(K) |
| --- | --- | --- | --- | --- | --- |
|    | red | green | blue | White | of white color |
| D1 | 19.7 | 46.6 | 4.6 | 110.8 | 5632 |
| D2 | 16.4 | 46.7 | 5.3 | 108.5 | 7381 |

Referring to table 1, the comparative display apparatus D1 has relatively higher the luminous efficiencies of a red color and a white color than the display apparatus D2 according to the aspect of the present disclosure. However, the display apparatus D2 according to the aspect of the present disclosure has relatively higher the luminous efficiency of a blue color and the color temperature of the white color than the comparative display apparatus D1. That is, in the display apparatus D2 according to the aspect of the present disclosure, a deviation between the blue efficiency in which the blue light having a short wavelength is generated and the red efficiency in which the red light having a long wavelength is generated may be reduced by the first emission stack 321 having a stacked structure of the red emission material layer 321re and the first blue emission material layer 321be, such that the white balance and the color temperature of the white color may be improved.

Accordingly, the display apparatus according to the aspect of the present disclosure may include the light-emitting device 300 emitting white light, wherein the light-emitting layer 320 of the light-emitting device 300 may include the first emission stack 321, the second emission stack 322, the third emission stack 323 and the fourth emission stack 324, which are sequentially stacked between the first electrode 310 and the second electrode 330, and wherein the first emission stack 321 may have a stacked structure of the red emission material layer 321re and the first blue emission material layer 321be. Thus, in the display apparatus according to the aspect of the present disclosure, the white balance and the color temperature of the white color may be improved. Therefore, in the display apparatus according to the aspect of the present disclosure, the overall luminance and the quality of the image may be improved.

The display apparatus according to the aspect of the present disclosure is described that the second emission stack 322 includes the second blue emission material layer 322be, the third emission stack 323 includes the green emission material layer 323ge, and the fourth emission stack 324 includes the third blue emission material layer 324be. However, in the display apparatus according to another aspect of the present disclosure, the second emission stack 322, the third emission stack 323 and the fourth emission stack 324 may be variously configured to realize a white color together with the red light and the blue light generated by the first emission stack 321. For example, in the display apparatus according to another aspect of the present disclosure, at least one of the second emission stack 322, the third emission stack 323 and the fourth emission stack 324 may generate light displaying a yellow color, and at least one of the other emission stacks may generate light displaying a cyan color.

Figure 3:
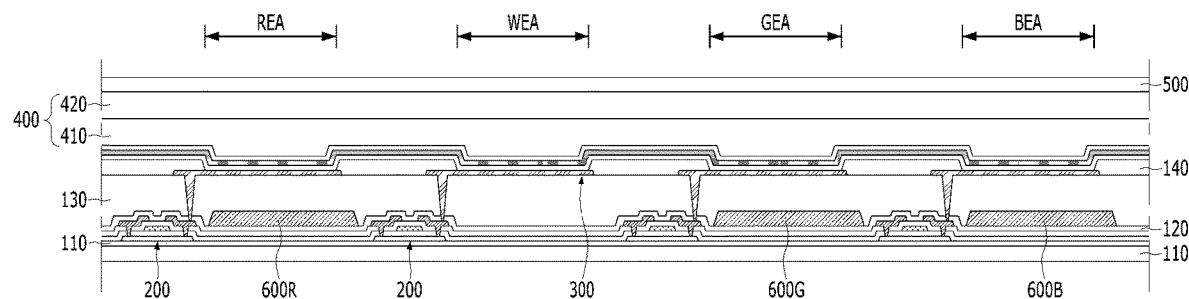
FIG. 3 is a view showing the display apparatus according to another aspect of the present disclosure.

The display apparatus according to another aspect of the present disclosure may include a plurality of the emission areas EA, wherein each of the emission areas EA may realize a color different from adjacent emission areas EA. For example, in the display apparatus according to another aspect of the present disclosure, the bank insulating layer 140 may define a red emission area REA, a white emission area WEA, a green emission area GEA and a blue emission area BEA, which are disposed side by side in a direction, as shown in FIG. 3. The driving circuit and the light-emitting device 300 may be disposed on each emission area REA, WEA, GEA and BEA. The driving circuit and the light-emitting device 300 of each emission area REA, WEA, GEA and BEA may have the same structure as the driving circuit and the light-emitting device 300 of adjacent emission area REA, WEA, GEA and BEA. The light-emitting device 300 on each emission area REA, WEA, GEA and BEA may emit the light displaying a white color. For example, the light-emitting device 300 on the white emission area WEA, the light-emitting device 300 on the green emission area GEA and the light-emitting device 300 on the blue emission area BEA may have the same structure as the light-emitting device 300 on the red emission area REA. A red color filter 600R overlapping with the red emission area REA, a green color filter 600G overlapping with the green emission area GEA and a blue color filter 600B overlapping with the blue emission area BEA may be disposed between the lower passivation layer 120 and the over-coat layer 130.

Figure 4A:
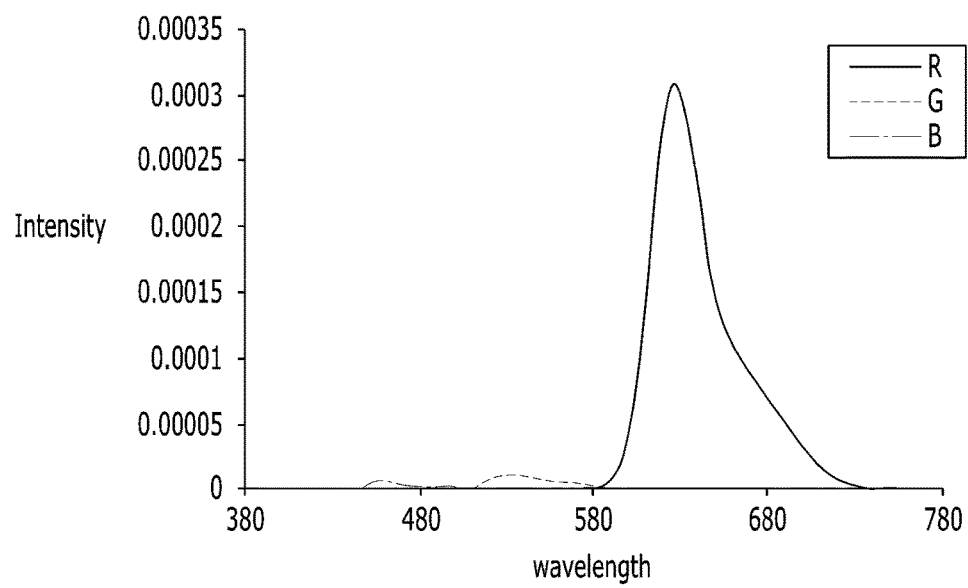
Figure 4B:
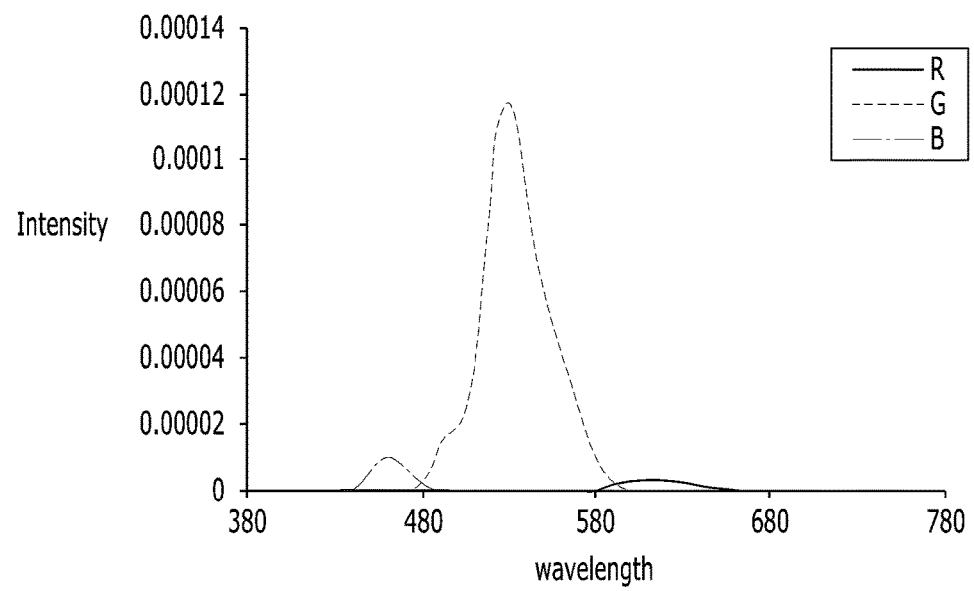
Figure 4C:
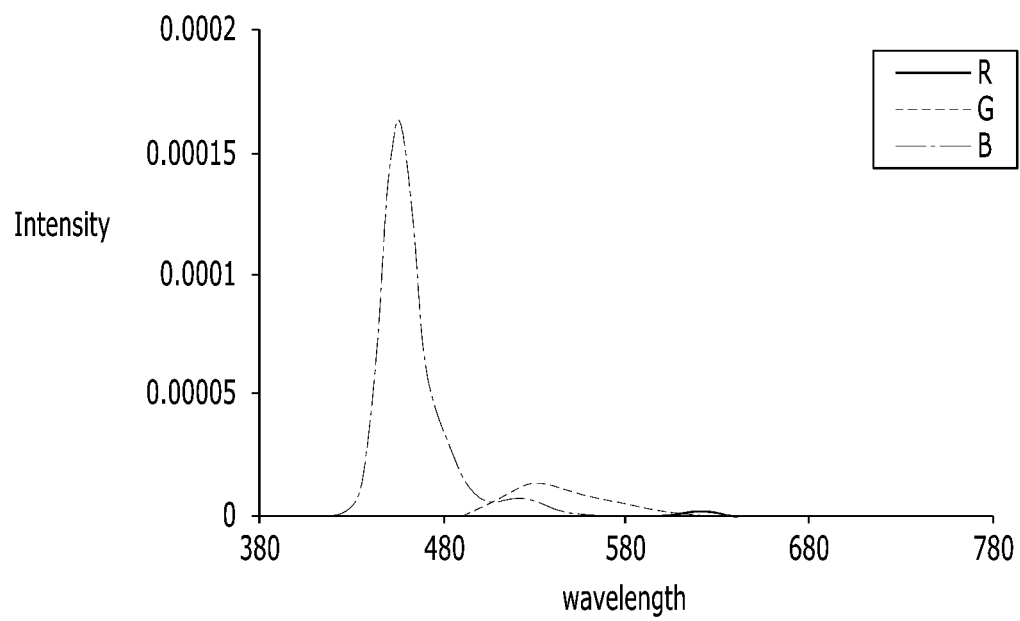
Figure 5A:
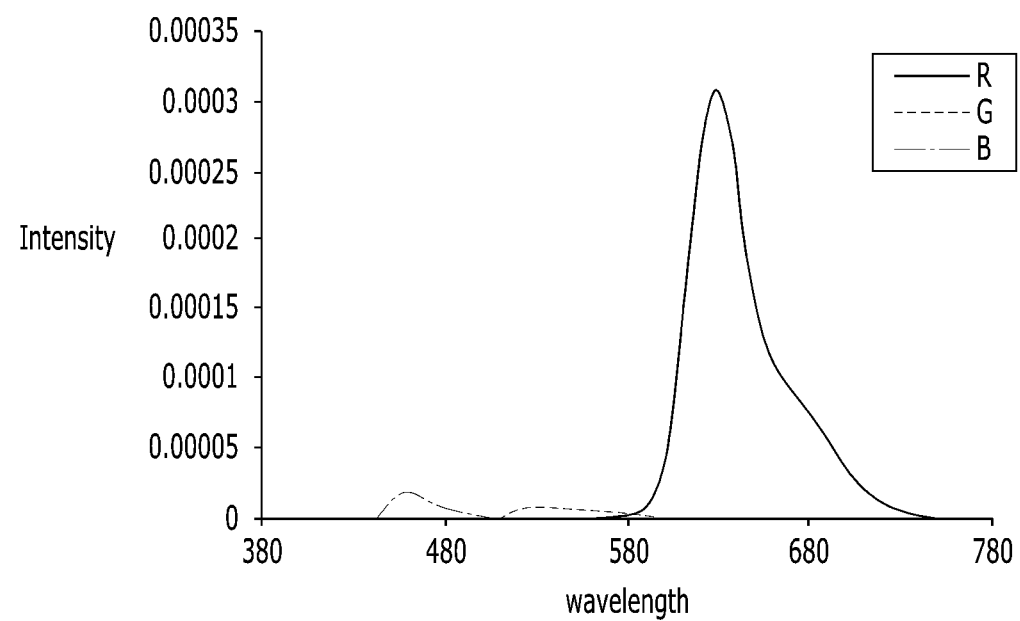

FIGS. 4A to 4C are graphs showing emission spectrum of the light emitted from a red pixel area, a green pixel area or a blue pixel area during low grayscale driving in RWBG display apparatus in which the red pixel area, a white pixel area, the blue pixel area and the green pixel area are repeated. FIGS. 5A to 5C are graphs showing emission spectrum of the light emitted from a red pixel area, a green pixel area or a blue pixel area during low grayscale driving in RWGB display apparatus in which the red pixel area, a white pixel area, the green pixel area and the blue pixel area are repeated.

Referring to FIGS. 4A to 4C and 5A to 5C, compared to the RWBG display device in which the white pixel area is disposed between the red pixel area and the blue pixel area, the light leakage of green color is reduced in the RWGB display device in which the white pixel area is disposed between the red pixel area and the green pixel area.

A below table 2 shows the color gamut according to current density in RWBG display apparatus and RWGB display apparatus.

TABLE 2

| | current density | color gamut | |
| --- | --- | --- | --- |
| | | DCI | BT.2020 |
| RWB | 10 mA/cm$^2$ | 99.0% | 81.0% |
| G | 0.1 mA/cm$^2$ | 65.6% | 48.3% |
| RWG | 10 mA/cm$^2$ | 99.0% | 81.0% |
| B | 0.1 mA/cm$^2$ | 76.9% | 56.9% |

Referring to table 2, the RWGB display apparatus has the color gamut relatively higher than the RWBG display apparatus at low grayscale driven by a low current density. That is, if red pixel areas, white pixel areas, green pixel areas and blue pixel areas are repeated in a direction, the light leakage of the green color may be reduced, and the color gamut at low grayscale may be improved. Thus, in the display apparatus according to the aspect of the present disclosure, the red pixel areas, the white pixel areas, the green pixel areas and the blue pixel areas may be arranged to be repeated in a direction, such that the deterioration of the image at low grayscale may be minimized.

Figure 6:
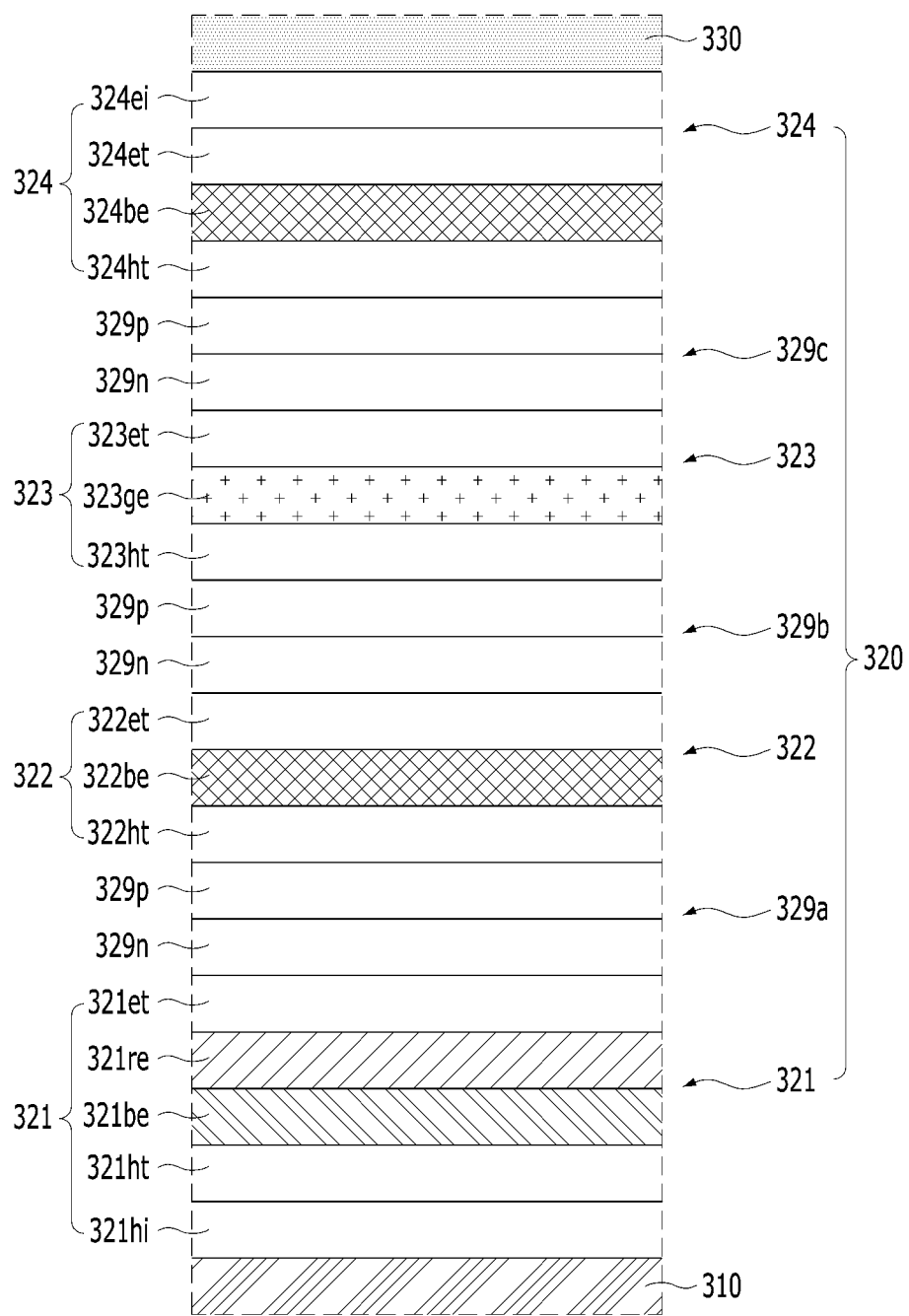
FIGS. 6 to 16 are views showing the display apparatus according to other aspects of the present disclosure.

The display apparatus according to the aspect of the present disclosure is described that the red emission material layer 321re is disposed between the first electrode 310 and the first blue emission material layer 321be. However, in the display apparatus according to another aspect of the present disclosure, the first emission stack 321 may have a stacked structure of the first blue emission material layer 321be being in contact with the first hole transport layer 321ht and the red emission material layer 321re being contact with the first electron transport layer 321et, as shown in FIG. 6. An upper surface of the first blue emission material layer 321be toward the first electron transport layer 321et may be in direct contact with a lower surface of the red emission material layer 321re toward the first hole transport layer 321ht. Thus, in the display apparatus according to another aspect of the present disclosure, the degree of freedom in a stacking order of the red emission material layer 321re and the first blue emission material layer 321be may be improved.

Figure 7:
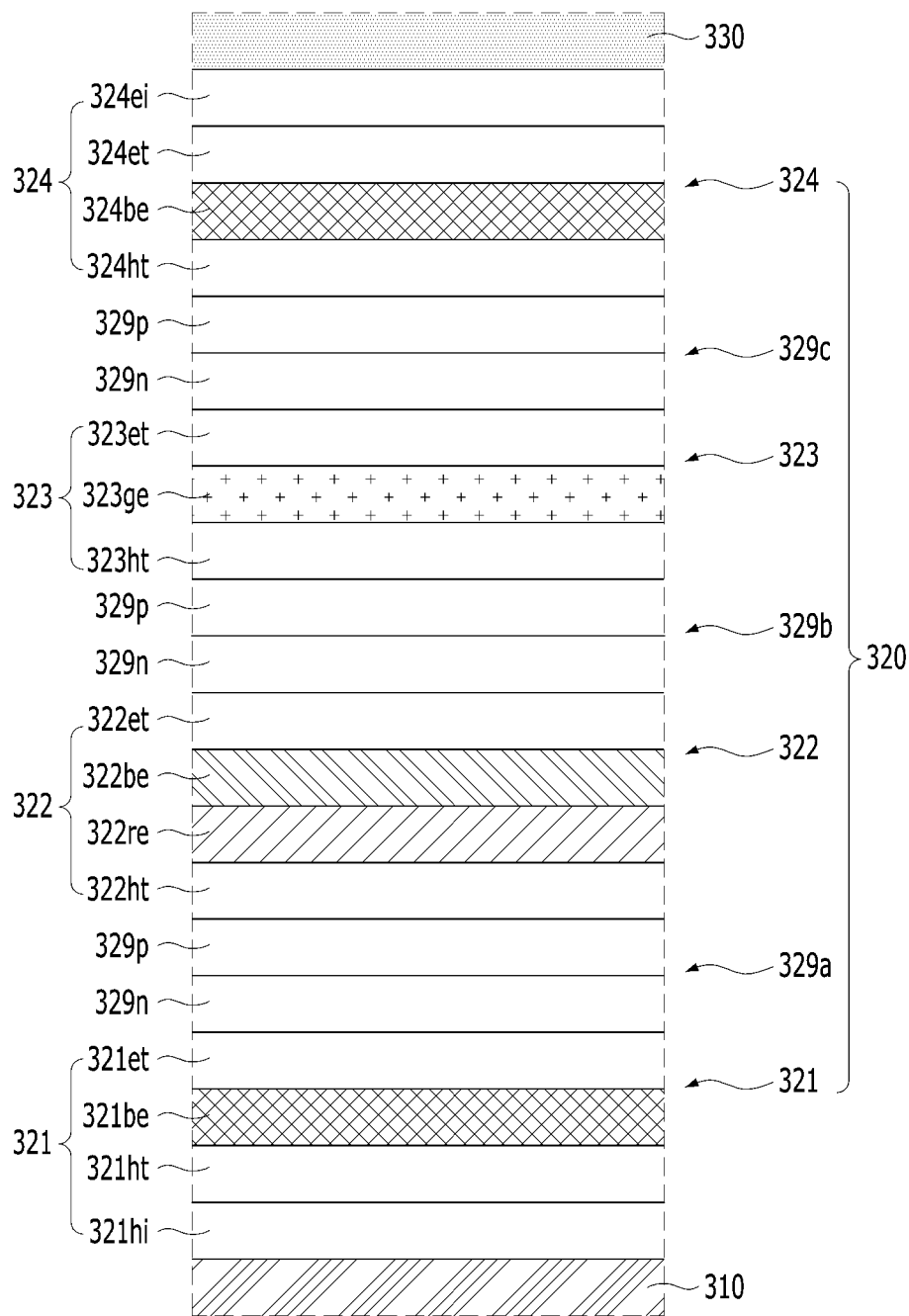
Figure 8:
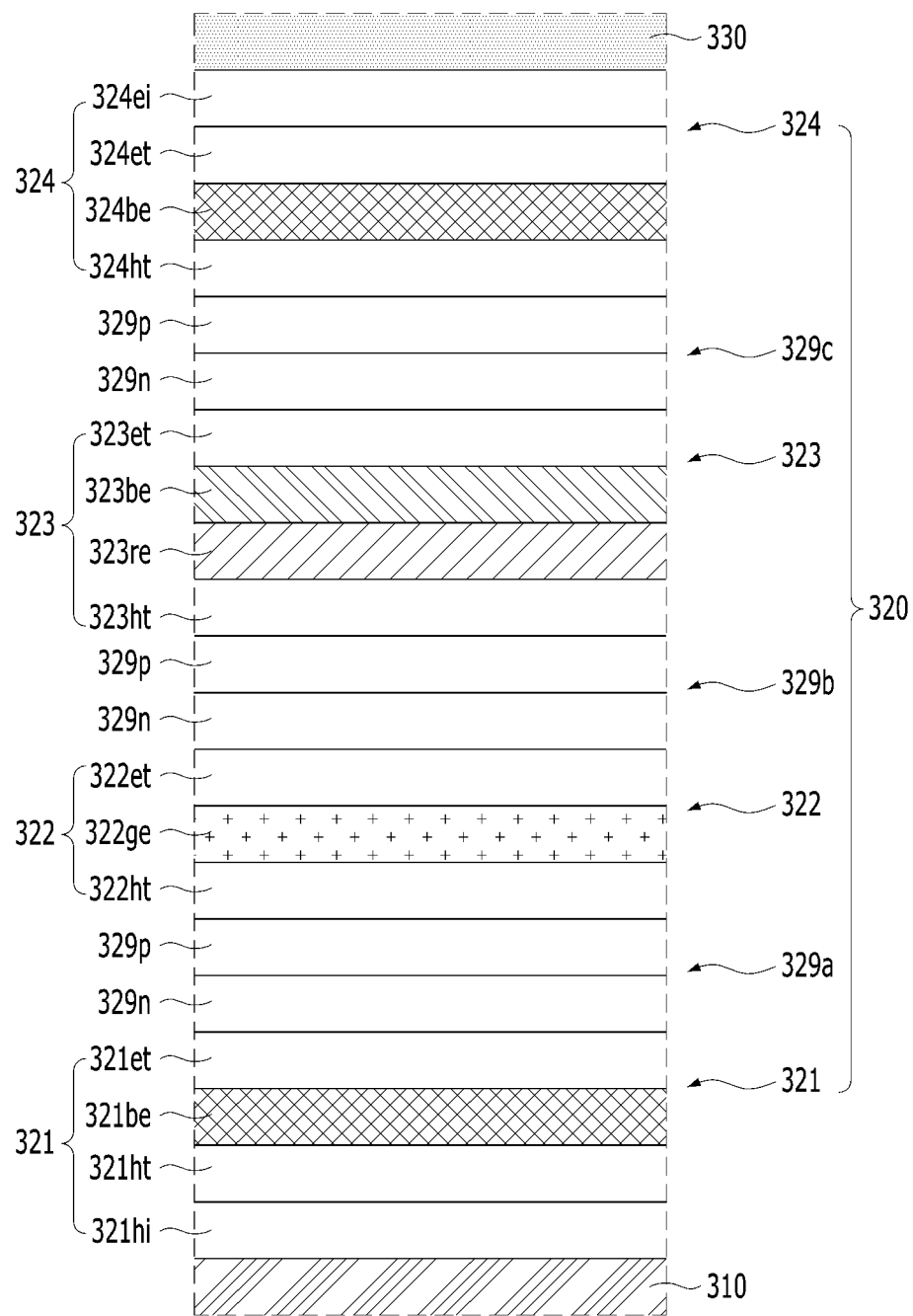
Figure 9:
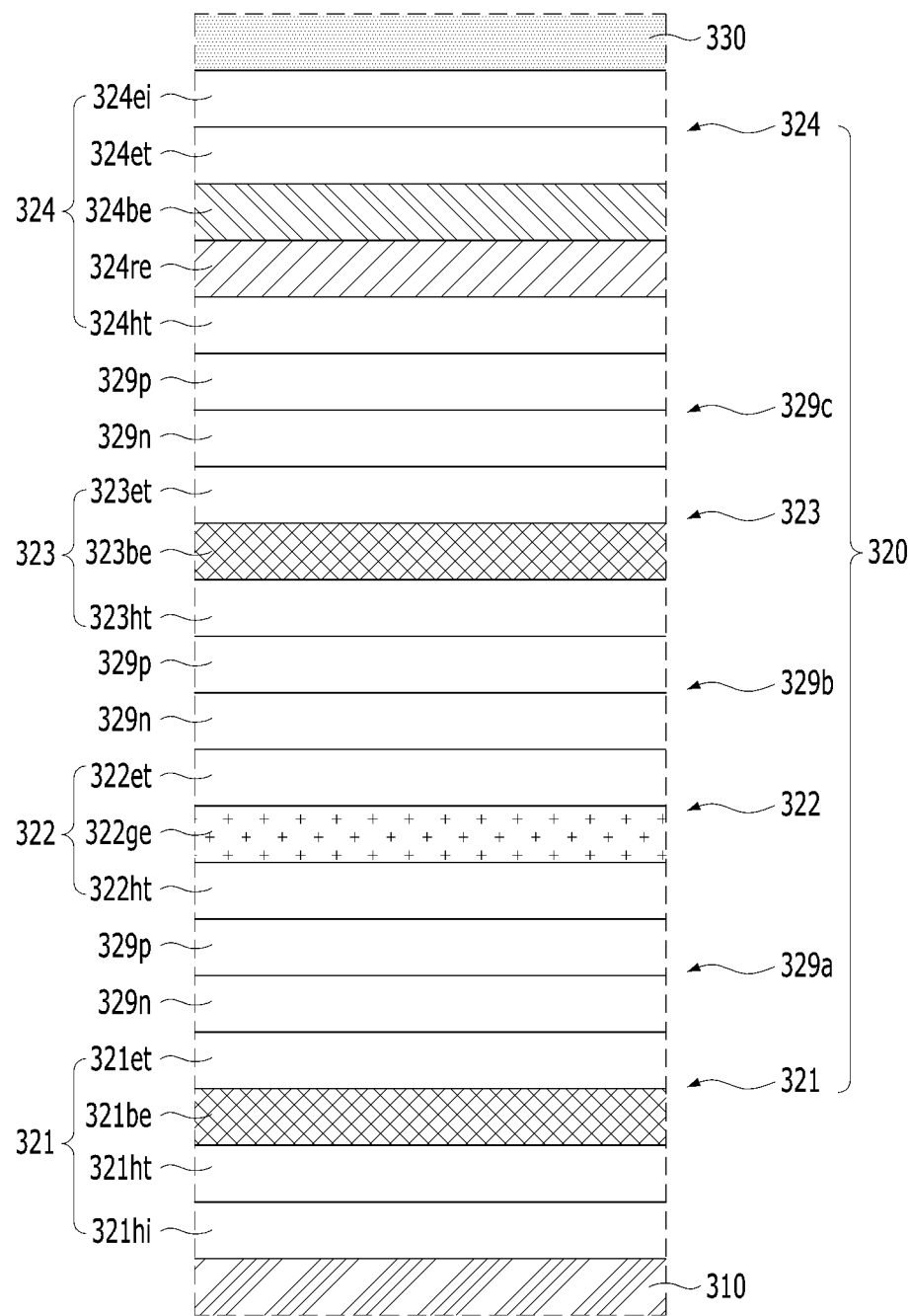

The display apparatus according to the aspect of the present disclosure is described that the first emission stack 321 being in contact with the first electrode 310 has a stacked structure of the red emission material layer 321re and the first blue emission material layer 321be. However, in the display apparatus according to another aspect of the present disclosure, the emission stack having a stacked structure of the red emission material layer and the blue emission material layer may be spaced away from the first electrode. For example, in the display apparatus according to another aspect of the present disclosure, the second emission stack 322 or the third emission stack 323 which is disposed between the charge generation layers 329a, 329b and 329c may have a stacked structure of the red emission material layer 322re and 323re and the blue emission material layer 322be and 323be, as shown in FIGS. 7 and 8. Alternately, in the display apparatus according to another aspect of the present disclosure, the fourth emission stack 324 disposed between the third charge generation layer 329c and the second electrode 330 may have a stacked structure of the red emission material layer 324re and the blue emission material layer 324be, as shown in FIG. 9. That is, in the display apparatus according to another aspect of the present disclosure, the degree of freedom in the location of the emission stack having a stacked structure of the red emission material layer and the blue emission material layer may be improved. Therefore, in the display apparatus according to another aspect of the present disclosure, the process efficiency may be improved.

Figure 10:
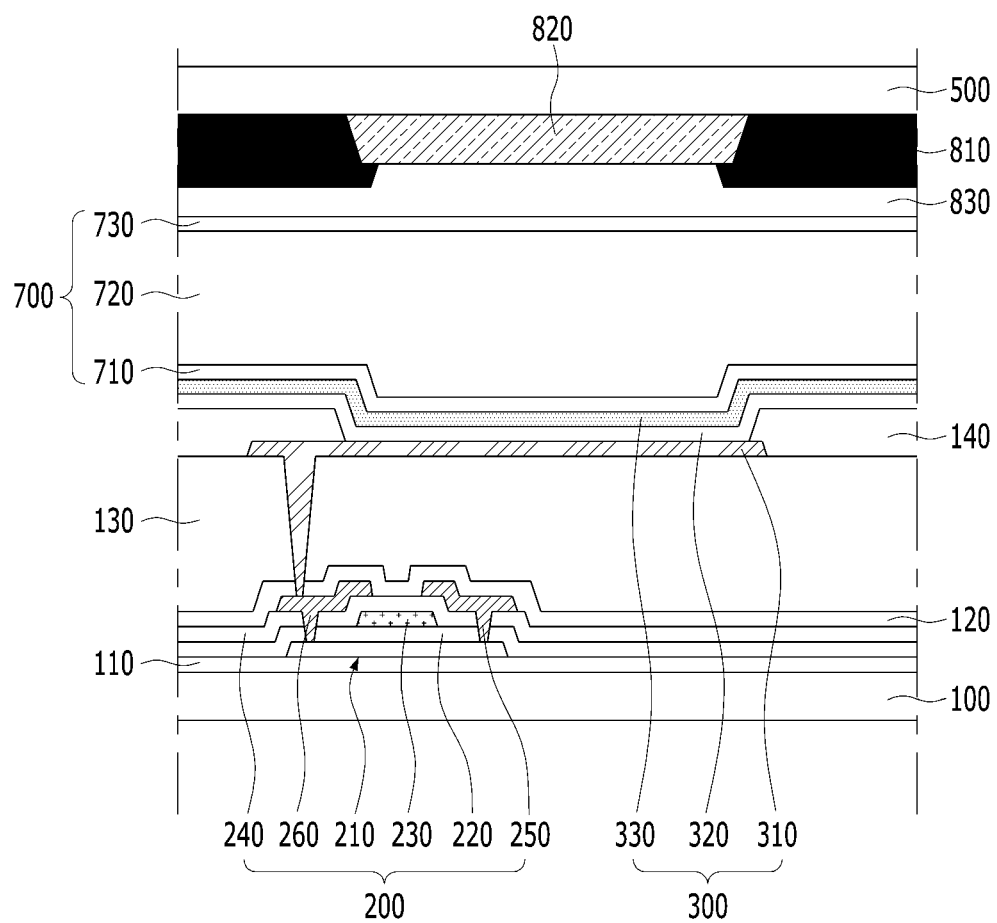

The display apparatus according to the aspect of the present disclosure is described that the light generated by the light-emitting layer 320 may be emitted to outside through the first electrode 310 and the device substrate 100. However, in the display apparatus according to another aspect of the present disclosure, the second electrode 330 may have a transmittance higher than the first electrode 310. For example, in the display apparatus according to another aspect of the present disclosure, a black matrix 810 and a color filter 820 may be disposed side by side between an encapsulation element 700 covering the light-emitting device 300 and the encapsulating substrate 500, as shown in FIG. 10. The encapsulating substrate 500 may include a transparent material. For example, the encapsulating substrate 500 may include glass or plastic.

The encapsulation element 700 may not include moisture absorbing particles. The encapsulating element 700 may have a stacked structure of layers made of different materials to block the penetration of the external moisture. For example, the encapsulation element 700 may include a first encapsulating layer 710, a second encapsulating layer 720 and a third encapsulating layer 730, which are sequentially stacked, the first encapsulating layer 710 and the third encapsulating layer 730 may include an inorganic insulating material, and the second encapsulating layer 720 may include an organic insulating material. Thus, in the display apparatus according to another aspect of the present disclosure, the damage of the light-emitting device 300 due to the external moisture and impact may be effectively prevented. A thickness difference due to the light-emitting device 300 may be removed by the second encapsulation layer 720. For example, an upper surface of the encapsulation element 700 opposite to the device substrate 100 may be a flat surface.

The color filter 820 may overlap the light-emitting device 300. The black matrix 810 may overlap the bank insulating layer 140. Thus, in the display apparatus according to another aspect of the present disclosure, the decrease of the light extraction efficiency due to the black matrix 810 may be prevented. And, in the display apparatus according to another aspect of the present disclosure, unnecessary regions may be not recognized by the user. Therefore, in the display apparatus according to another aspect of the present disclosure, the visibility of the realized image may be improved.

A filter capping layer 830 may be disposed between the encapsulation element 700 and the black matrix 810. The filter capping layer 830 may extend between the encapsulation element 700 and the color filter 820. For example, the black matrix 810 and the color filter 820 may be in direct contact with the encapsulating substrate 500. The filter capping layer 830 may include an insulating material. For example, the filter capping layer 830 may include an organic insulating material. The lower surface of the filter capping layer 830 toward the device substrate 100 may be a flat surface. Thus, in the display apparatus according to another aspect of the present disclosure, an upper surface of the encapsulating substrate 500 opposite to the device substrate 100 may be parallel to a lower surface of the device substrate 100 opposite to the encapsulating substrate 500. Therefore, in the display apparatus according to another aspect of the present disclosure, the distortion of the image provided to the user through the encapsulating substrate 500 may be prevented.

Figure 11:
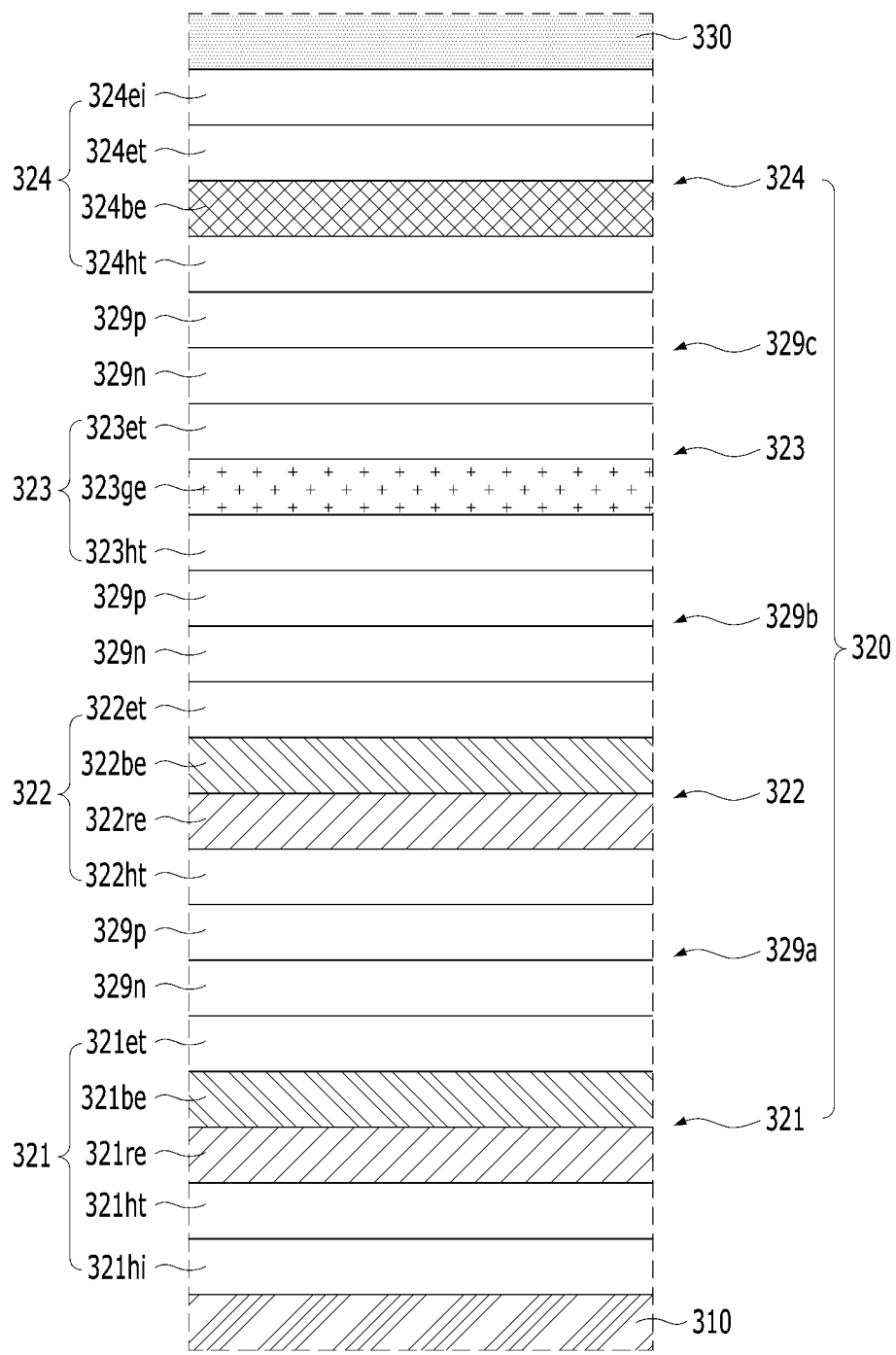

In the display apparatus according to another aspect of the present disclosure, two of the four emission stacks constituting the light-emitting layer may have a stacked structure of the red emission material layer and the blue emission material layer. For example, in the display apparatus according to another aspect of the present disclosure, the first emission stack 321 being disposed close to the first electrode 310 may have a stacked structure of a first red emission material layer 321re and a first blue emission material layer 321be, and the second emission stack 322 being in direct contact with the first emission stack 321 may have a stacked structure of a second red emission material layer 322re and a second blue emission material layer 322be, as shown in FIG. 11.

A below table 3 shows the white efficiency, the red efficiency, the green efficiency, and the blue efficiency of an area inclined by 60° compared to the front in a first display apparatus E1 in which only one of the fourth emission stacks has a stacked structure of the red emission material layer and the blue emission material layer and a second display apparatus E2 in which two of the fourth emission stacks has a stacked structure of the red emission material layer and the blue emission material layer.

TABLE 3

| | efficiency(%) | | | |
|---|---|---|---|---|
| | white | red | green | blue |
| E1 | 78 | 78 | 81 | 72 |
| E2 | 89 | 91 | 92 | 83 |

Referring to table 3, the second display apparatus E2 may have the white efficiency, the red efficiency, the green efficiency, and the blue efficiency in an area inclined by 60° from the front relatively higher than the first display apparatus E1. Thus, in the display apparatus according to another aspect of the present disclosure in which the first emission stack 321 and the second emission stack 322 of the light-emitting layer 320 have a stacked structure of the red emission material layer 321re and 322re and the blue emission material layer 321be and 322be, the color viewing angle may be increased. That is, in the display apparatus according to another aspect of the present disclosure, the rapid deterioration of the image due to a change in the user's location may be prevented. Therefore, in the display apparatus according to another aspect of the present disclosure, the quality of the image may be improved.

A below table 4 shows the deviation in the viewing angle of white color according to a stacking order of the first red emission material layer 321re and the first blue emission material layer 321be of the first emission stack 321 and a stacking order of the second red emission material layer 322re and the second blue emission material layer 322be of the second emission stack 322 in the display apparatus according to another aspect of the present disclosure. Herein, R-B/R-B means a structure in which the first red emission material layer 321re, the first blue emission material layer 321be, the second red emission material layer 322re, and the second blue emission material layer 322be are sequentially stacked on the first electrode 310, R-B/B-R means a structure in which the first red emission material layer 321re, the first blue emission material layer 321be, the second blue emission material layer 322be and the second red emission material layer 322re are sequentially stacked on the first electrode 310, B-R/R-B means a structure in which the first blue emission material layer 321be, the first red emission material layer 321re, the second red emission material layer 322re and the second blue emission material layer 322be are sequentially stacked on the first electrode 310, and B-RB-R means a structure in which the first blue emission material layer 321be, the first red emission material layer 321re, the second blue emission material layer 322be and the second red emission material layer 322re are sequentially stacked on the first electrode 310.

TABLE 4

| | R-B/R-B | R-B/B-R | B-R/R-B | B-R/B-R |
|---|---|---|---|---|
| the deviation in the viewing angle of white color | 0.008 | 0.018 | 0.018 | 0.028 |

Referring to table 4, the deviation in the viewing angle of white color is minimal in the structure in which the first red emission material layer 321re, the first blue emission material layer 321be, the second blue emission material layer 322be and the second red emission material layer 322re are sequentially stacked on the first electrode 310. Thus, in the display apparatus according to another aspect of the present disclosure, the first emission stack 321 may include the first red emission material layer 321re disposed between the first electrode 310 and the first blue emission material layer 321be, and the second red emission material layer 322re and the second blue emission material layer 322be of the second emission stack 322 may have the same stacking order as the first red emission material layer 321re and the first blue emission material layer 321be of the first emission stack 321. Therefore, in the display apparatus according to another aspect of the present disclosure, the degradation of image quality due to viewing angle deviation may be minimized.

Figure 12:
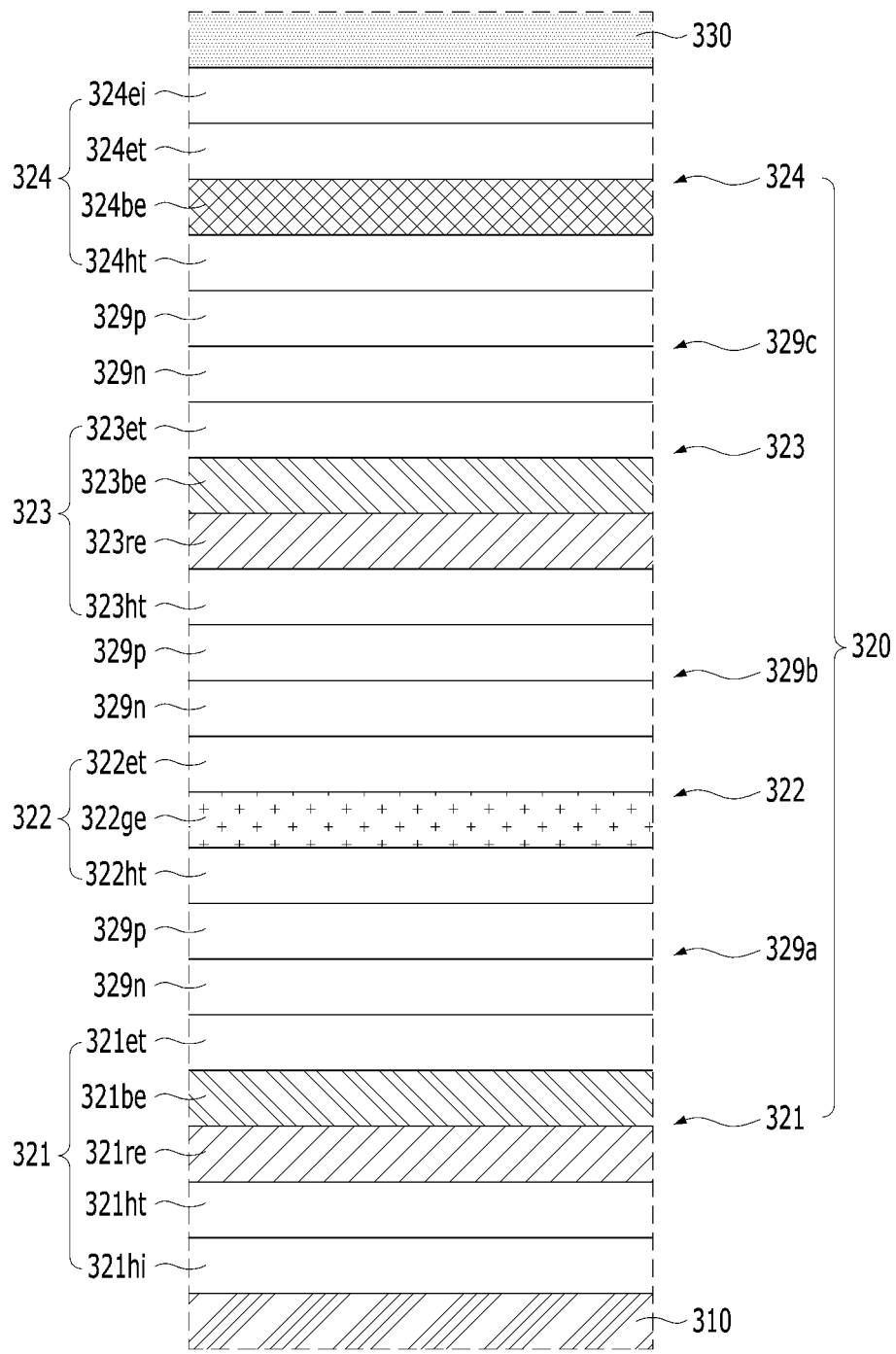
Figure 13:
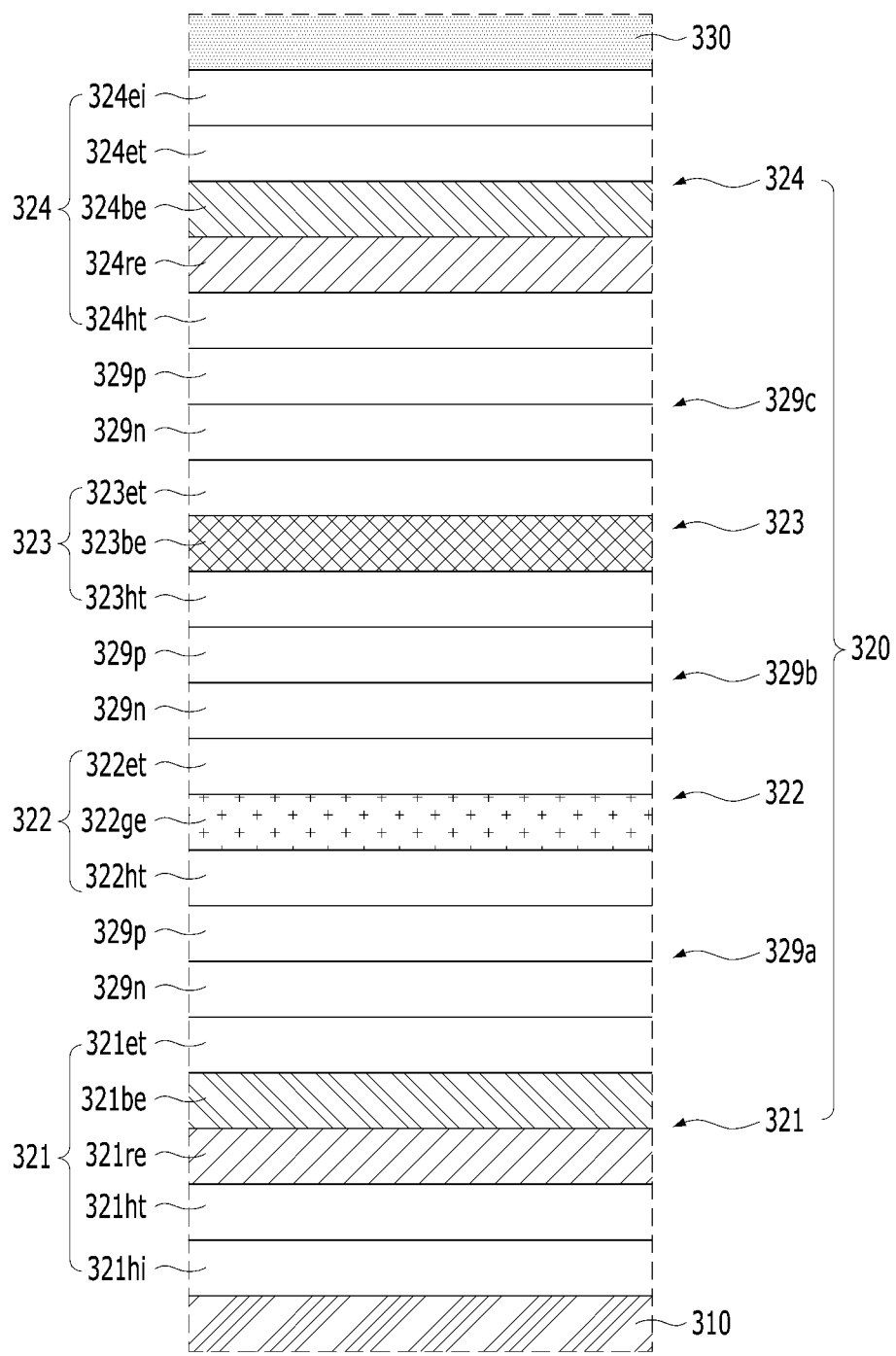
Figure 14:
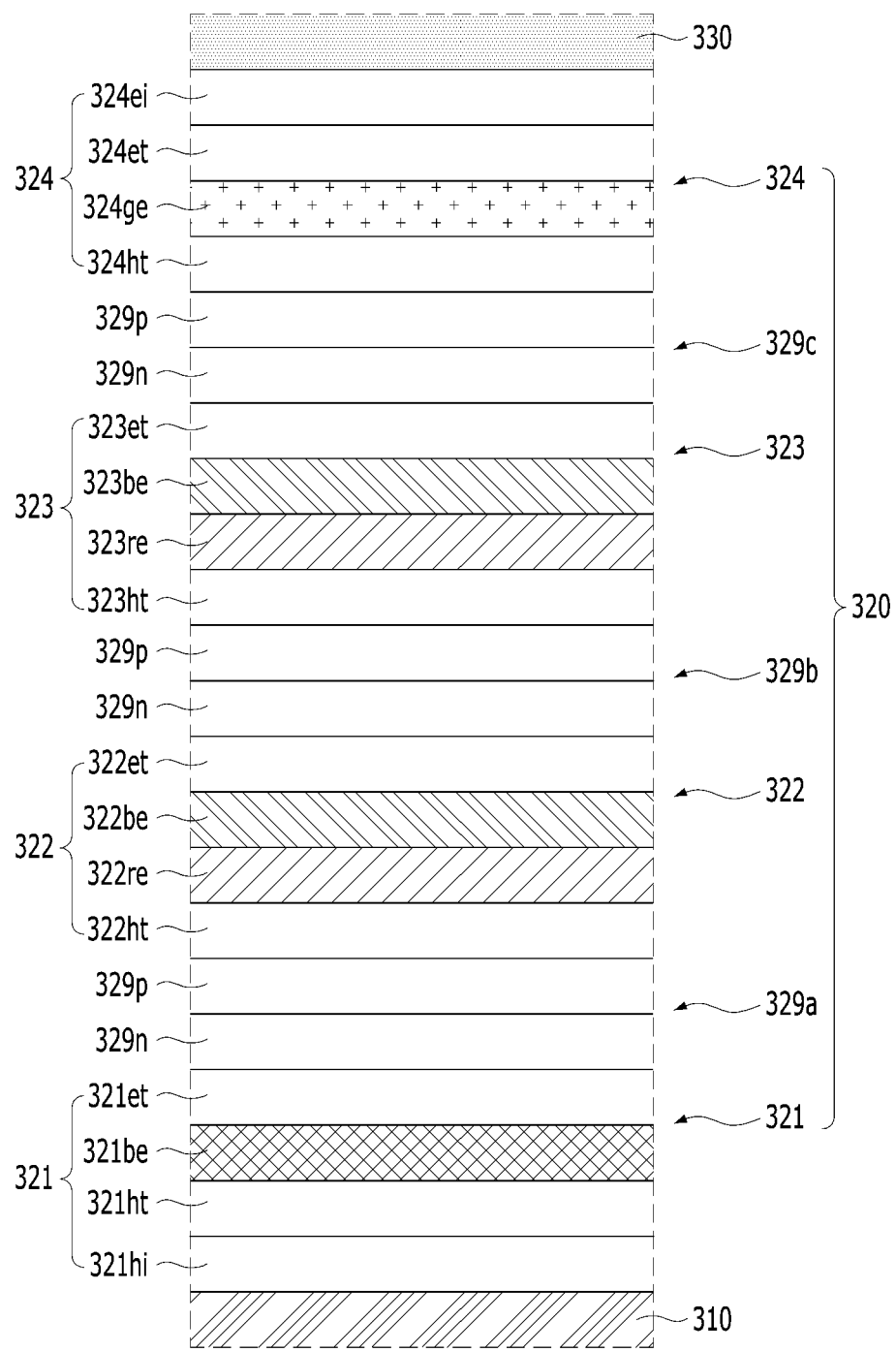
Figure 15:
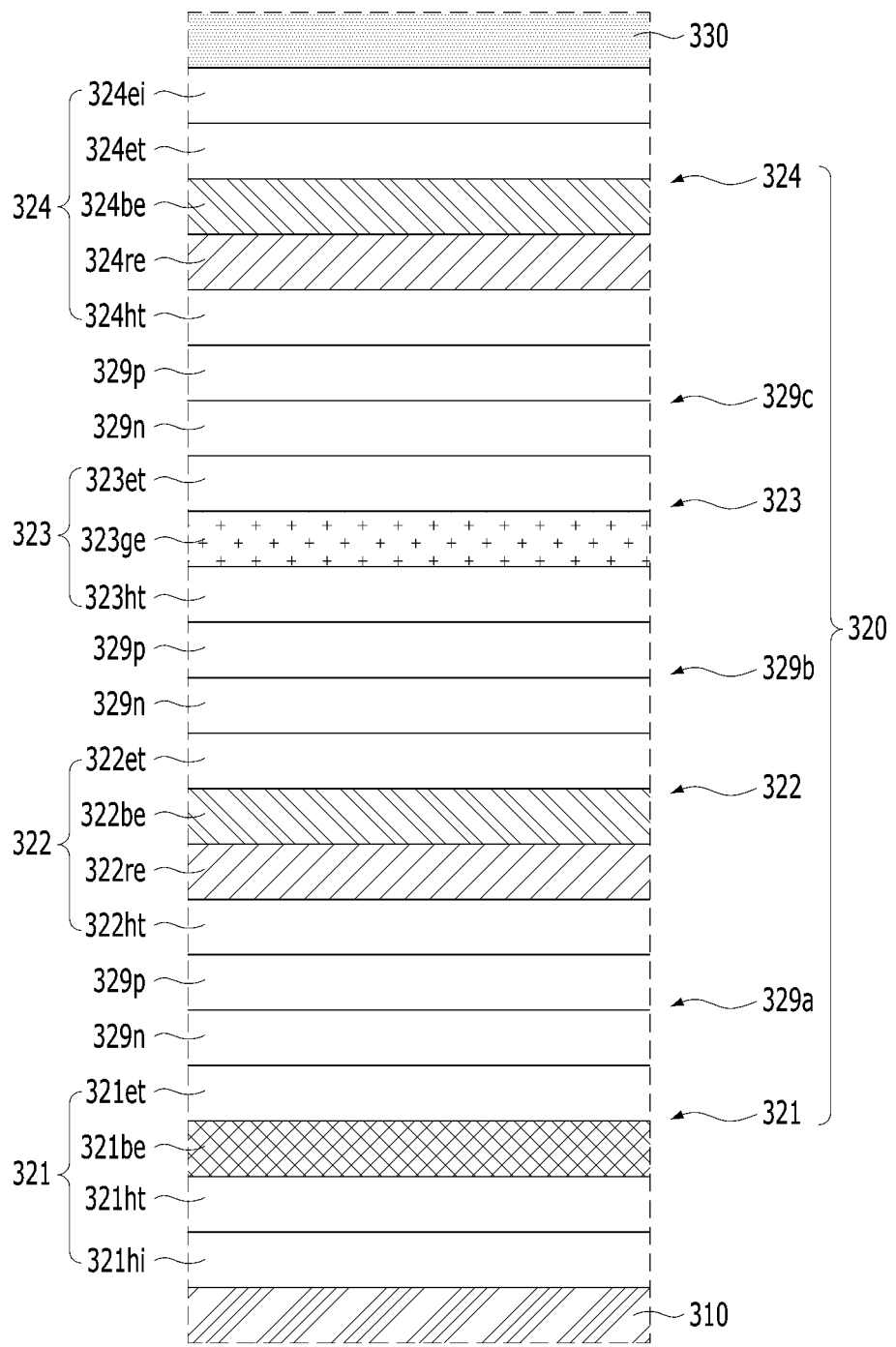
Figure 16:
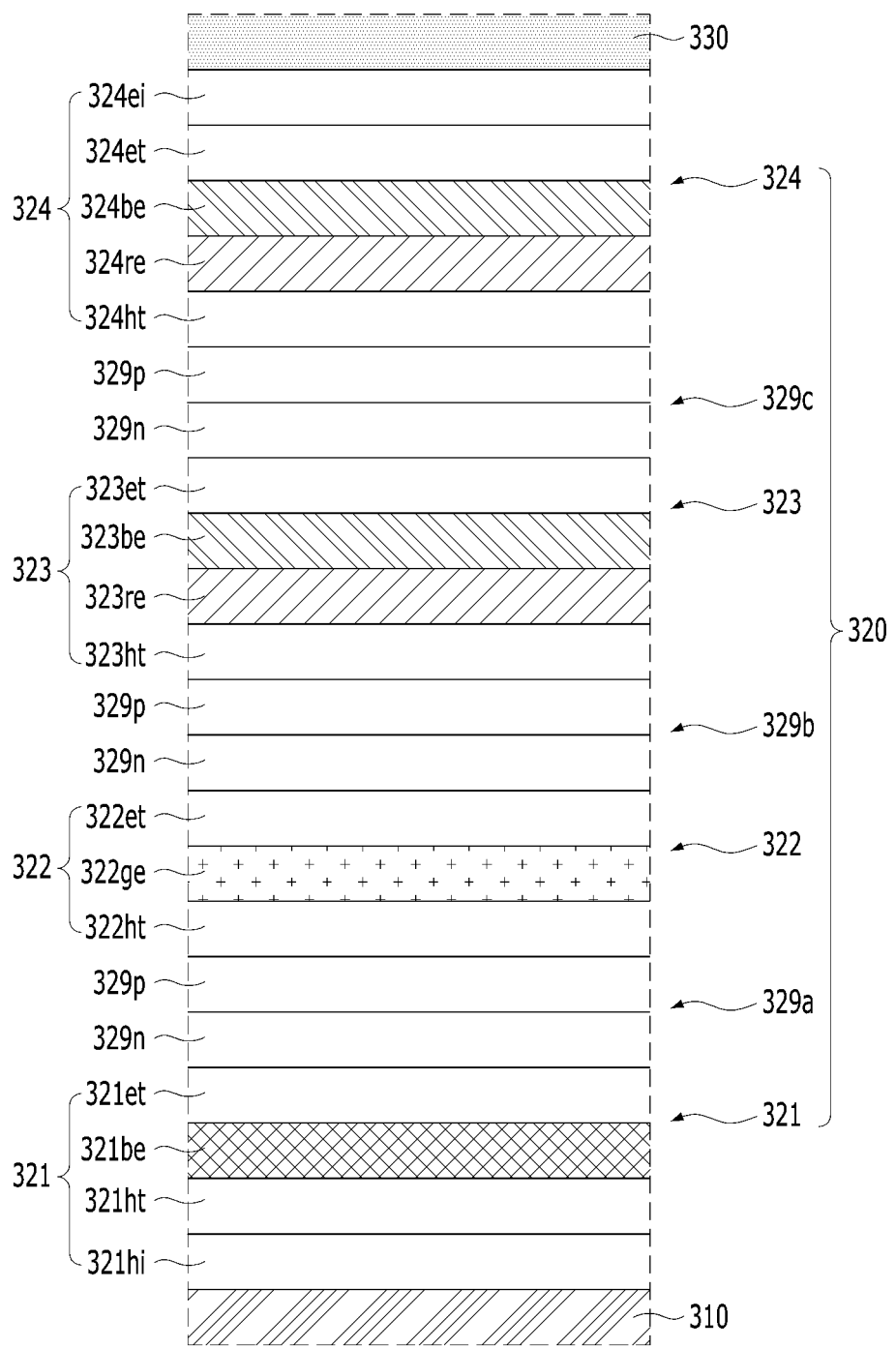

In the display apparatus according to another aspect of the present disclosure, the third emission stack 323 or the fourth emission stack 324 being spaced away from the first emission stack 321 having a stacked structure of the first red emission material layer 321re and the first blue emission material layer 321be may have a stacked structure of the red emission material layer 323re and 324re and the blue emission material layer 323be and 324be, as shown in FIGS. 12 and 13. And, in the display apparatus according to another aspect of the present disclosure, the first emission stack 321 being in contact with the first electrode 310 may include only blue emission material layer 321be, two of the second emission stack 322, the third emission stack 323 and the fourth emission stack 324 which are disposed between the first emission stack 321 and the second electrode 330 may have a stacked structure of the red emission material layer 322re, 323re and 324re and the blue emission material layer 322be, 323be and 324be. Thus, in the display apparatus according to another aspect of the present disclosure, the degree of freedom m for the configuration of the light-emitting layer 320 may be improved.

In the result, the display apparatus according to the aspects of the present disclosure may include the light-emitting device on the device substrate, wherein the light-emitting device may include fourth emission stacks, and wherein one of the emission stacks may have a stacked structure of the red emission material layer and the blue emission material layer. Thus, in the display apparatus according to the aspects of the present disclosure, the white balance of the light emitted from each light-emitting device may be improved. And, in the display apparatus according to the aspects of the present disclosure, the color viewing angle of the light emitted from each light-emitting device may be improved. Thereby, in the display apparatus according to the aspects of the present disclosure, the quality of the image provided to the user may be improved.

What is claimed is:

1. A display apparatus comprising:
a second electrode disposed on a first electrode; and
a light-emitting layer disposed between the first electrode and the second electrode and generating light displaying a white color,
wherein the light-emitting layer includes four emission stacks and charge generation layers disposed between the emission stacks,
wherein one of the emission stacks has a stacked structure of a first red emission material layer and a first blue emission material layer, and
wherein at least one of the emission stacks emits light having a different color from the emission stack having a stacked structure of the first red emission material layer and the first blue emission material layer.

2. The display apparatus according to claim 1, wherein the first blue emission material layer is in contact with the first red emission material layer.

3. The display apparatus according to claim 1, wherein the light-emitting layer includes a first emission stack, a second emission stack, a third emission stack and a fourth emission stack, which are sequentially stacked on the first electrode, and
wherein the first emission stack includes the first red emission material layer and the first blue emission material layer.

4. The display apparatus according to claim 3, wherein reflectance of the second electrode is higher than reflectance of the first electrode.

5. The display apparatus according to claim 3, wherein the second emission stack includes a second blue emission material layer, the third emission stack includes a green emission material layer, and the fourth emission stack includes a third blue emission material layer.

6. The display apparatus according to claim 5, wherein the second blue emission material layer and the third blue emission material layer include a same material as the first blue emission material layer.

7. The display apparatus according to claim 5, wherein the fourth emission stack further includes a second red emission material layer.

8. The display apparatus according to claim 7, wherein the second red emission material layer includes a same material as the first red emission material layer.

9. A display apparatus comprising:
a bank insulating layer disposed on a device substrate and defining a first emission area;
a first light-emitting device including a first electrode, a light-emitting layer and a second electrode, which are sequentially stacked on the first emission area of the device substrate; and
an encapsulation element on the first light-emitting device,
wherein the light-emitting layer has a stacked structure of a first emission stack including a first red emission material layer and a first blue emission material layer, a second emission stack including a second blue emission material layer, a third emission stack including a green emission material layer, and a fourth emission stack including a third blue emission material layer.

10. The display apparatus according to claim 9, wherein the third emission stack is disposed between the second emission stack and the fourth emission stack.

11. The display apparatus according to claim 9, wherein the second emission stack disposed close to the first emission stack further includes a second red emission material layer, and
wherein a stacking order of the second red emission material layer and the second blue emission material layer is the same as a stacking order of the first red emission material layer and the first blue emission material layer.

12. The display apparatus according to claim 11, wherein the first red emission material layer is disposed between the first electrode and the first blue emission material layer.

13. The display apparatus according to claim 9, wherein the first emission area emits a red color,
wherein the bank insulating layer defines a second emission area emitting a white color, a third emission area emitting a green color, and a fourth emission area emitting a blue color,
wherein the first emission area, the second emission area, the third emission area and the fourth emission area are arranged to be repeated in a direction, and
wherein the second emission area is disposed between the first emission area and the third emission area.

14. The display apparatus according to claim 13, further comprising:
a second light-emitting device disposed on the second emission area of the device substrate;
a third light-emitting device disposed on the third emission area of the device substrate; and
a fourth light-emitting device disposed on the fourth emission area of the device substrate,
wherein the second light-emitting device, the third light-emitting device and the fourth light-emitting device have a same structure as the first light-emitting device.

15. The display apparatus according to claim 14, further comprising;

a red color filter disposed between the device substrate and the first light-emitting device;
a green color filter disposed between the device substrate and the third light-emitting device; and
a blue color filter disposed between the device substrate and the fourth light-emitting device.

\* \* \* \* \*